(12) United States Patent
Shrivastava

(10) Patent No.: US 7,954,025 B2
(45) Date of Patent: May 31, 2011

(54) SCAN ARCHITECTURE FOR FULL CUSTOM BLOCKS

(75) Inventor: Manish Shrivastava, Campbell, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 12/849,385

(22) Filed: Aug. 3, 2010

(65) Prior Publication Data

US 2011/0010593 A1 Jan. 13, 2011

Related U.S. Application Data

(62) Division of application No. 11/857,717, filed on Sep. 19, 2007, now Pat. No. 7,793,180.

(60) Provisional application No. 60/826,168, filed on Sep. 19, 2006.

(51) Int. Cl.
*G01R 31/28* (2006.01)
(52) U.S. Cl. .................................................. 714/726
(58) Field of Classification Search .................. 714/726; 327/202
See application file for complete search history.

(56) References Cited

U.S. PATENT DOCUMENTS

| | | | |
|---|---|---|---|
| 4,862,068 A | 8/1989 | Kawashima et al. | |
| 5,041,742 A | 8/1991 | Carbonaro | |
| 5,568,429 A | 10/1996 | D'Souza et al. | |
| 5,619,511 A * | 4/1997 | Sugisawa et al. | 714/726 |
| 6,023,179 A * | 2/2000 | Klass | 327/211 |
| 6,434,069 B1 | 8/2002 | Heightley et al. | |
| 6,639,443 B1 | 10/2003 | Campbell | |
| 6,686,775 B2 | 2/2004 | Campbell | |
| 6,950,973 B2 | 9/2005 | Campbell | |
| 7,000,164 B2 | 2/2006 | Siegel et al. | |
| 7,487,417 B2 | 2/2009 | Branch et al. | |
| 7,596,732 B2 | 9/2009 | Branch et al. | |
| 7,793,180 B1 | 9/2010 | Shrivastava | |
| 2003/0226077 A1 | 12/2003 | Zyuban et al. | |
| 2005/0138512 A1 | 6/2005 | Inuzuka et al. | |

OTHER PUBLICATIONS

Notice of Allowance issued in U.S. Appl. No. 12/547,727, dated Nov. 26, 2010.

* cited by examiner

*Primary Examiner* — James C Kerveros

(57) ABSTRACT

A output storage latch within a combinational logic circuit may be adapted to form a scan flip-flop latch that supports both functional operation and scan chain testing of a combinational logic matrix included in the combinational logic circuit. A described master/slave clock approach allows the scan flip-flop latch to support receiving into a scan chain a sequence of test input data, execution of combinational logic matrix testing based on the test input data, and sequentially outputting test results to a test result register for comparison with expected results. The described scan flip-flop latch may be used along side unaltered output storage latches thereby allowing flexibility with respect to the number and placement scan chain test points within an integrated circuit. Use of the described dual-use scan flip-flop latch results in a less complex circuit design, reduced circuit area requirements and improved reliability.

15 Claims, 10 Drawing Sheets

SCAN ARCHITECTURE FOR FULL CUSTOM BLOCKS

INCORPORATION BY REFERENCE

This is a Division of application Ser. No. 11/857,717 filed Sep. 19, 2007, now U.S. Pat. No. 7,793,180, which claims the benefit of U.S. Provisional Application No. 60/826,168, "Scan Architecture for Full Custom Blocks in C8830" filed by Manish Shrivastava on Sep. 19, 2006. The disclosures of the prior applications are hereby incorporated by references herein in their entireties.

BACKGROUND

FIG. 1 shows an internal scan chain test structure for testing combinational logic matrices included in an integrated circuit on a semiconductor chip. In the scan chain test structure, multiplexed flip-flops MF1 102, MF2 106, MF3 108, MF4 110 and MF5 104 may receive test input data values in sequence while clocked by a scan clock signal. For example, when a first scan clock pulse is received, input terminal SI of multiplexed flip-flop MF1 102 may receive a first test input data value. When a second scan clock pulse is received, input terminal SI of second multiplexed flip-flop MF2 106 may receive the first test input data value from output terminal SO of multiplexed flip-flop MF1 102, and input terminal SI of multiplexed flip-flop MF1 102 may receive a second test input data value.

Accordingly, when a fifth scan clock pulse is received, multiplexed flip-flop MF5 104 may receive the first test input data value from output terminal SO of multiplexed flip-flop MF4 110. Meanwhile, input terminal SI of multiplexed flip-flop MF4 110 may receive the second test input data value from output SO of multiplexed flip-flop MF3 108. Input terminal SI of multiplexed flip-flop MF3 108 may receive the third test input data value from output SO of multiplexed flip-flop MF2 106. Input terminal SI of multiplexed flip-flop MF2 106 may receive the fourth test input data value from output SO of multiplexed flip-flop MF1 102. Input terminal SI of multiplexed flip-flop MF1 102 may receive the fifth test input data value.

When a pulse from the system clock is received, combinational logic 112 may receive test input data from multiplexed flip flops not shown in FIG. 1. Further, combinational logic 114 may receive the fifth test input data value from output terminal Q of multiplexed flip-flop MF1 102 and the fourth test input data value from output terminal Q of multiplexed flip-flop MF2 106, and combinational logic 116 may receive the third test input data value from output terminal Q of multiplexed flip-flop MF3 108, the second test input data value from output terminal Q of multiplexed flip-flop MF4 110, and the first test input data value from output terminal Q of multiplexed flip-flop MF5 104 so that combinational logic matrices 112, 114, 116 may be tested.

As a result of passing the test input data to the respective combinational logic matrices, test output data generated by combinational logic 112 may be output to input terminals D of multiplexed flip-flop MF1 102 and multiplexed flip-flop MF2 106, and test output data generated by combinational logic 114 may be output to input terminals D of multiplexed flips flops MF3 108, MF4 110 and MF5 104.

Therefore, when the next scan clock is activated, output terminal SO of multiplexed flip-flop MF5 104 may output a first test result; output terminal SO of multiplexed flip-flop MF4 110 may output a second test result to input terminal SI of multiplexed flip-flop MF5 104; output terminal SO of multiplexed flip-flop MF3 108 may output a third test result to input terminal SI of multiplexed flip-flop MF4 110; output terminal SO of multiplexed flip-flop MF2 106 may output a fourth test result to input terminal SI of multiplexed flip-flop MF3 108; and output terminal SO of multiplexed flip-flop MF1 102 may output a fifth test result to input terminal SI of multiplexed flip-flop MF2 106. Accordingly, in response to the fifth scan clock, output terminal SO of multiplexed flip-flop MF5 104 may output the fifth test result.

Thus, the combinational logic matrices included on an integrated circuit semiconductor chip may be tested with an internal scan chain. The above steps may be used to determine whether the combinational logic modules in the integrated circuit function normally prior to packaging the circuit for operational use.

Although the circuit described above with respect to FIG. 1 may be used to support internal scan testing of a combinational logic circuit, an internal scan chain testing based on the insertion a multiplexed flip-flop along each data line in the combinational logic circuit requires additional chip space, thereby reducing the space available for implementing functional circuits. Further, due to the complexity of a multiplexed flip-flop based approach, the chance of introducing faults within the scan chain circuitry itself is greatly increased.

SUMMARY

In accordance with the described approach, output storage latches which were originally configured to support only functional processing performed by a combinational logic circuit may be adapted to support scan chain testing as well as functional processing performed by the combinational logic circuit.

For example, output storage latches within a combinational logic circuit may be adapted to further support: (1) a scan chain test preparation mode in which a sequence of test input data may be received and passed along a chain of similarly modified output storage latches in preparation for a test, (2) a scan chain test execution mode in which the loaded test data may be passed to a combinational logic for execution and the generated output results may be stored to the modified output storage latches, and (3) a scan chain test output mode in which received scan chain test results may be sequentially passed along the scan chain and output to a test result register.

Such a dual use approach can reduce the surface area requirements for implementing scan chain testing within an integrated circuit by reducing the number of additional transistors that would otherwise be needed to support an equivalent level of scan chain testing. Further, the approach can result in a less complex circuit layout than previous approaches for implementing scan chain testing within an integrated circuit, and thereby reducing the likelihood of faults and improving circuit reliability.

In addition, combinational logic circuits may be selectively modified so that circuits that support scan chain testing may be strategically placed at key locations throughout the integrated circuit design to selectively test and/or monitor the performance of the functional combinational logic circuits. Based upon the described modified circuit design and a modified system of control clock signals, modified output storage latches may be used along-side unaltered output storage latches that receive data from the same combinational logic matrix. Such flexibility allows greater flexibility with respect to the number and placement scan chain test points within the logic circuit.

In an exemplary embodiment, such a combinational logic circuit may include, an input latch that controls passage of a binary input data signal through the input latch, based on a master phase clock signal of a two-phase clock, to combinational logic that receives the binary input data signal and generates an output data signal based on applying combinational logic to the received binary input data signal. Further, the exemplary combinational logic circuit may include an passthrough switch that controls passage of the output data signal generated by the combinational logic matrix, based on a slave phase clock signal of the two-phase clock, to an output storage latch that stores a binary output data signal value based on a level of the received output data signal. In addition, the output storage latch may include a first transistor that controls a connection between the output storage latch and a LOW logic signal source such that when the output data signal is passed to the output storage latch, the first transistor is open, thereby facilitating the establishment of a new output data value in the output storage latch.

In another exemplary embodiment, an exemplary integrated circuit that supports scan chain based testing of combinational logic matrices within the integrated circuit may include, a plurality of combinational logic matrices, each combinational logic including, a plurality of input data line connections, a plurality of output data line connections, and a plurality of interconnected logic elements configured to receive a binary input data value on each of the plurality of input data line connections, to process the received input data values based on the interconnected logic elements, and to produce a binary output data value on each of the plurality of output lines. Further, the exemplary integrated circuit may include at least one input latch array, each input latch in the array controlling passage of a binary input data value to one of the plurality of input data line connections of one of the plurality of combinational logic matrices. In addition, the exemplary integrated circuit may include a plurality of scan flip-flop modules, each of the scan flip-flop modules including, an passthrough switch that controls passage of a binary output data value received on one of the plurality of output lines, based on a value of a first slave phase clock signal of the two-phase clock, a scanning control circuit that passes one of a scan test input data value and a scan test output data value based on a value of a scan clock signal, and an output storage latch that receives one of a data value from the passthrough switch and a data value from the scan control circuit. The output storage latch in a first scan flip-flop module may include a first output port that may connect to an input port of the scanning control circuit of a second scan flip-flop module, so that an output data value stored by the output storage latch may be passed to the input port of the scanning control circuit of the next scan flip-flop latch in the chain. Further, a second output port of the output storage latch of a first scan flip-flop module may connect to an input port of an input latch that controls passage of data to a next combinational logic matrix. In addition, the output storage latch may include a first transistor that opens and closes based on the value of a scan clock signal and a second transistor that opens and closes based on an inverted value of the slave phase clock signal, such that when either the first transistor or the second transistor is open a connection between the output storage latch and a LOW signal source is open, thereby facilitating the establishment of a new output data value in the latch.

An exemplary method of performing a scan chain test of a combinational logic unit within the above exemplary integrated circuits may include, setting a first mode of operation by setting a slave phase clock signal to a fixed value, thereby setting combinational logic circuits with output storage latches that are not part of the scan chain to a pass-through mode. Further, the master phase clock may be set to a fixed value that opens the latches in the input latch array, and the scan slave phase clock signal may be set to a fixed value thereby opening the latches in the output latch array, thereby blocking a flow of data through the combinational logic matrices of the circuit. Once the flow of data is blocked in such a manner, a scan clock may be cycled to pass, with each scan clock cycle, a data value received on the input port of the scanning control circuit to the output storage latch, and to receive a new data value on the input port of the scanning control circuit. In this manner input data may be scanned into the scan chain. Next, a second mode of operation may be set by setting a scan clock signal to a fixed value, thereby deactivating the passage of data along the scan chain, cycling a master phase clock signal for one cycle to pass test input data stored on the output storage latches into a combinational logic matrix, and cycling the scan slave phase clock signal for one cycle to pass test output data generated by the combinational logic into the output storage latches. Finally, the mode of operation may be set back to the first mode of operation, and the scan clock may be cycled sequentially pass the generated test output data from the scan chain.

BRIEF DESCRIPTION OF THE DRAWINGS

Exemplary embodiments of a scan chain test flip-flop latch and exemplary embodiments of a clock circuit that supports operation of the scan chain test flip-flop latch will be described with reference to the following drawings, wherein like numerals designate like elements, and wherein:

FIG. 2b shows an exemplary pin-out block representation of the latch circuit, or latch, shown in FIG. 2a;

DETAILED DESCRIPTION OF EMBODIMENTS

Figure 2A:
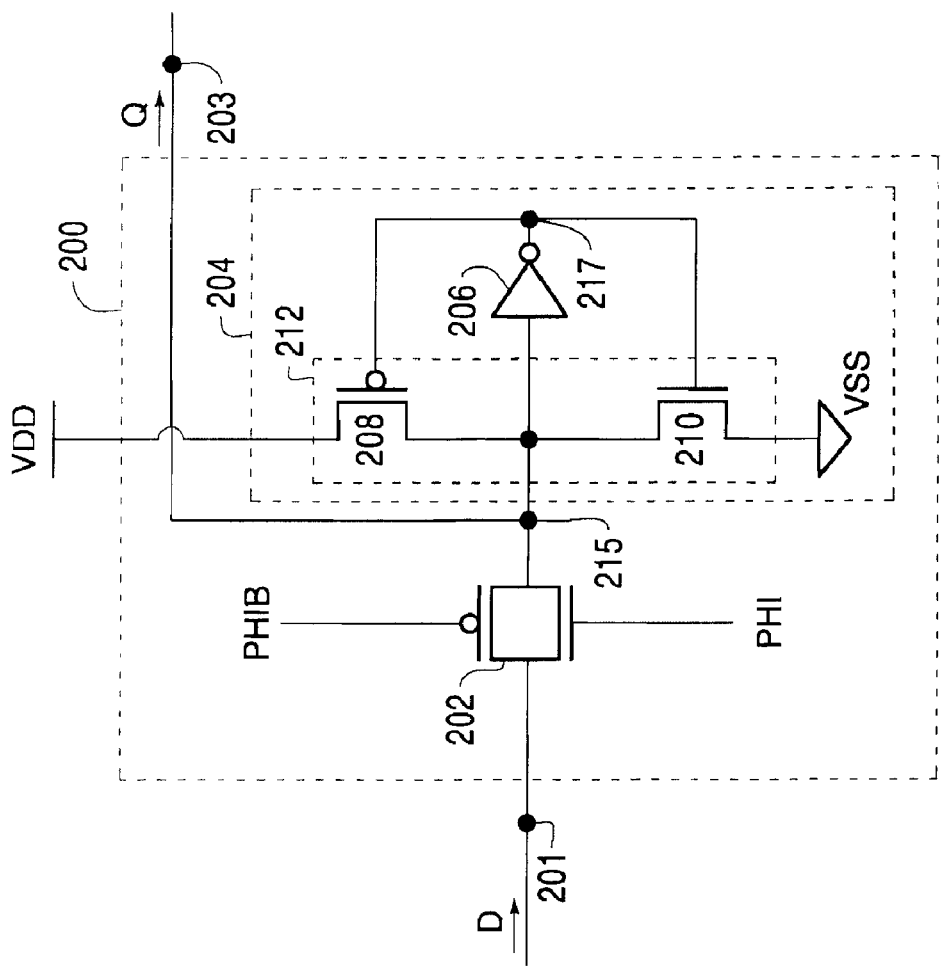
FIG. 2a shows an exemplary latch circuit.

FIG. 2a shows an exemplary latch circuit, or latch, 200. As shown in FIG. 2, latch 200, may include a pass transistor switch 202 and a storage circuit 204 that may include a feed forward inverter 206, and a feedback inverter 212, shown in FIG. 2 as including p-type transistor 208 and n-type transistor 210.

As further shown in FIG. 2, pass transistor switch 202 may include an n-type control gate, PHI, a p-type control gate, PHIB, an input gate and an output gate. The input gate of pass transistor switch 202 may be connected to a binary data signal at node 201 and an output gate of pass transistor switch 202 may be connected to node 215. One of a source and a drain of p-type transistor 208 may be connected to a HIGH voltage source, VDD, while the other of the source and the drain of p-type transistor 208 may be connected to node 215. One of a source and a drain of n-type transistor 210 may be connected to a LOW voltage source, VSS, while the other of the source and the drain of n-type transistor 210 may be connected to node 215. A input of forward feed inverter 206 may be connected to node 215, and the output of forward feed inverter 206 may be connected to both the gate of p-type transistor 208 and the gate of n-type transistor 210.

In operation, when a HIGH logic signal is received on n-type control gate, PHI, and a LOW logic signal is received on p-type control gate, PHIB, pass transistor switch 202 is closed and a binary signal data value, D, may be passed from node 201 to node 215. When a LOW logic signal is received on n-type control gate, PHI, and a HIGH logic signal is received on p-type control gate, PHIB, pass transistor switch 202 is opened, and the data value passed through pass transistor switch 202 to node 215 may be maintained by storage circuit 204, indefinitely, or until replaced with a subsequent data value received from pass transistor switch 202. The data value maintained by storage circuit 204 may be presented as a binary signal data value, Q, at node 203.

If a HIGH value is placed at node 215 the value is inverted by inverter 206 and a LOW value is placed on node 217. A LOW value on node 217 results in closing p-type transistor 208 and opening n-type transistor 210. As a result, node 215 is connected to HIGH voltage source VDD and the value at node 215 is held HIGH. Alternatively, if a LOW value is placed at node 215 the value may be inverted by inverter 206 and applied to the gates of both p-type transistor 208 and n-type transistor 210. As a result of placing a HIGH value at node 217, p-type transistor 208 opens and n-type transistor 210 closes thereby forming a direct connection between node 215 and VSS. In this manner the value at 215 may be maintained at a LOW value.

Figure 2B:
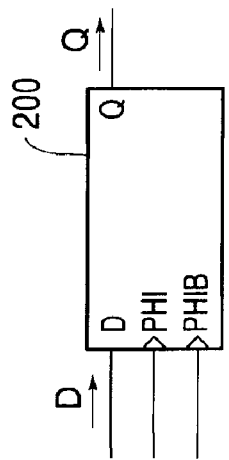
Figure 3:
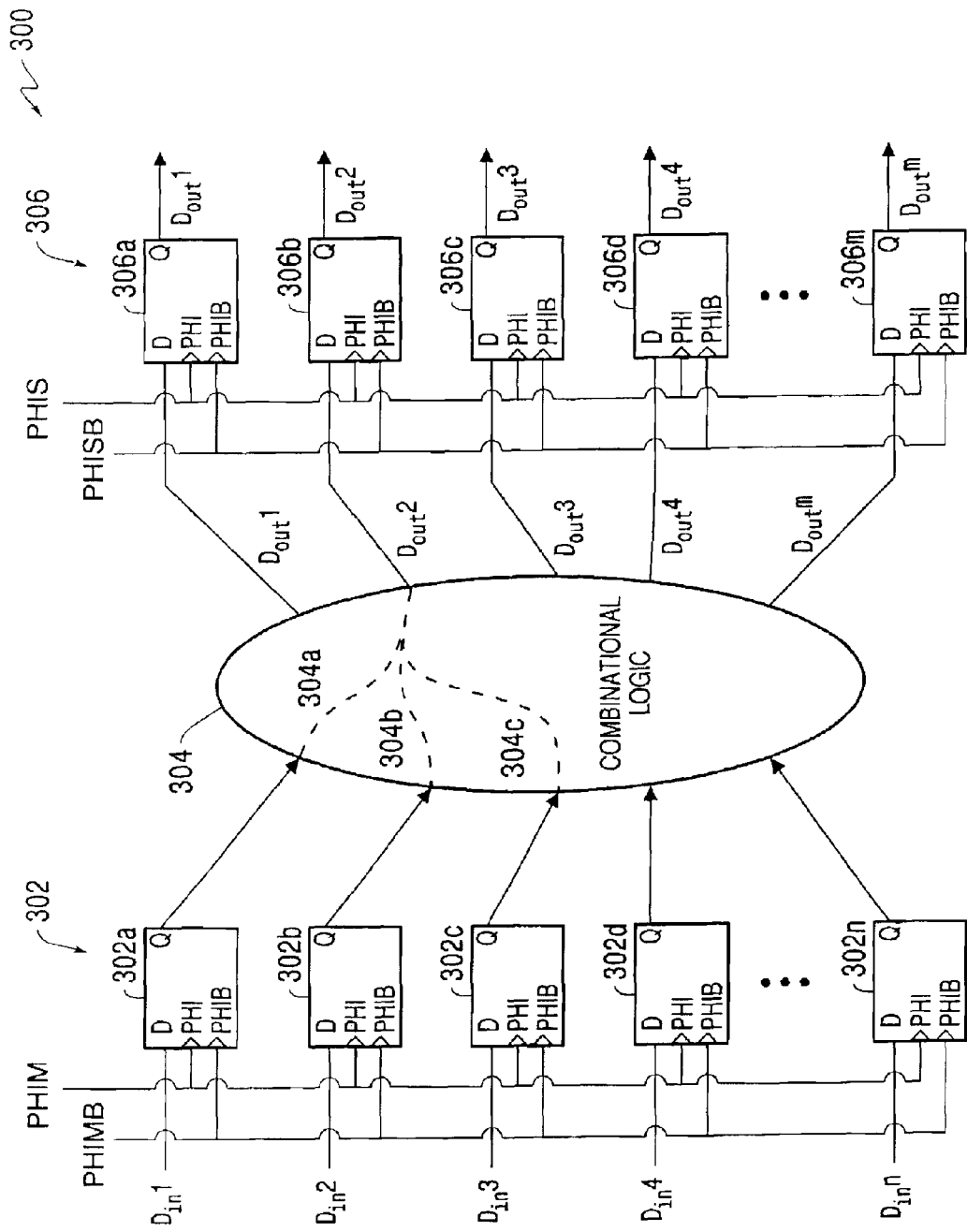
FIG. 3 shows an exemplary portion of a semiconductor integrated circuit (IC) combinational logic circuit that includes an array of master input latches, combinational logic, and an array slave output latches.

FIG. 2b shows an exemplary pin-out block representation of latch circuit 200, or latch, shown in FIG. 2a. As shown in FIG. 3, the pin-out block representation of latch circuit 200 includes input pins D, PHI, PHIB and output pin Q. These input and output pins correspond with the input and output nodes described above with respect to FIG. 2a. Specifically, input D represents node 201 in FIG. 2a. PHI and PHIB correspond to the n-type and p-type control gates, respectively; and output Q represents node 203 in FIG. 2a. Leads shown in FIG. 2a connected to HIGH voltage source, VDD, and LOW voltage source, VSS, are not shown in the pin-out block representation of latch circuit 200, by convention.

In subsequent figures described in this application, both the circuit based representation of latch 200, as shown in FIG. 2a and the pin-out block representation of latch circuit 200, as shown in FIG. 2b may be used. For example, the circuit-based representation of latch circuit 200, as shown in FIG. 2a, may be used in figures in which the details of the latch are needed to facilitate comparison of the circuit with circuits described in other figures. The pin-out block representation of latch circuit 200, as shown in FIG. 2a, may be used to conserve drawing space in figures in which multiple latches are shown, and the significant point being illustrated is that the latches may be formed in an array capable of receiving and/or transmitting a plurality of binary signal data values in support of a combinational logic circuit.

Figure 1:
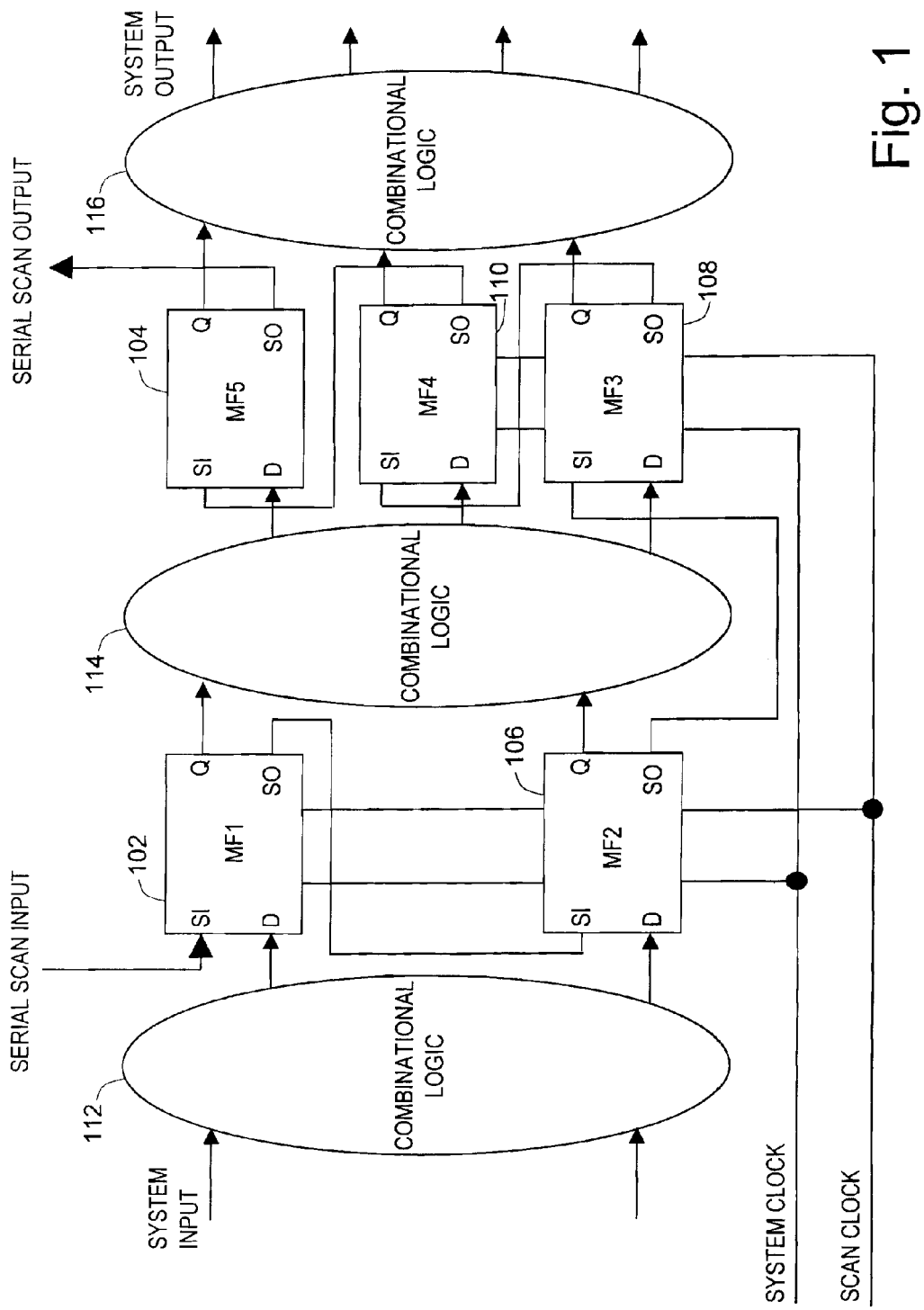
FIG. 1 shows the internal scan chain of a test chip.

FIG. 3 is exemplary portion of a combinational logic circuit 300. Combinational logic circuit 300 may be capable of receiving input binary values, submitting the received binary values to a combinational logic matrix, and generating and indefinitely storing the output values of the combinational logic matrix. However, the circuit 300 shown in FIG. 3 does not include an internal scan chain structure for testing the combinational logic included in the circuit, such as the scan chain structure described above with respect to FIG. 1.

As shown in FIG. 3, combinational logic circuit 300 may include an array of master input latches 302, a combinational logic 304, and an array of slave output latches 306. As further shown in FIG. 3, combinational logic circuit 300 may be controlled by master phase clock signal (PHIM), inverted master phase clock signal (PHIMB), slave phase clock signal (PHIS), and inverted slave phase clock signal (PHISB). As addressed in greater detail below, PRIM and PHIS may be master and slave phase clock signals of a two-phase clock generated from external master clock EM_CLK. As such, during normal functional operations, PHIM and PHIS are never HIGH at the same time.

Master input latch array 302 may include a plurality of master input latches 302a-n, each latch within the array may be the same as latch 200 described above with respect to FIG. 2a and FIG. 2b, and each latch within the array may open and close simultaneously based on the value of master phase clock signal (PRIM). For example, when PHIM is HIGH (and PHIMB is LOW), all of master input latches 302a-n may close and may allow a binary input value on each of the respective input leads $D_{in}1$ through $D_{in}n$ to pass to a corresponding input port in combinational logic 304; however, when PHIM is LOW (and PHIMB is HIGH), all of master input latches 302a-n may open, thereby isolating combinational logic 304 from each of the respective input lines $D_{in}1$ through $D_{in}n$.

Combinational logic 304 may include a plurality of interconnected logic elements, e.g., AND, NAND, OR, NOR, etc., that may be prearranged to receive binary input data values, i.e., an electrical signal that corresponds to one of a HIGH logic value, or a LOW logic value, on each of input lines $D_{in}1$ through $D_{in}n$ and to process the received input data values based on the preconfigured logic circuits contained in combinational logic 304 to produce binary output data values, i.e., an electrical signal that corresponds to one of a HIGH logic value, or a LOW logic value, on each of output lines $D_{out}1$ through $D_{out}m$.

It should be noted that, for the sake of clarity, combinational logic circuit 300 shown in FIG. 3 shows a plurality of input lines $D_{in}1$ through $D_{in}n$ to combinational logic 304, and a plurality of data output lines $D_{out}1$ through $D_{out}m$. For convenience sake, this document may refer to input lines $D_{in}1$ through $D_{in}n$ collectively, and individually, as $D_{in}x$, and may refer to output lines $D_{out}1$ through $D_{out}m$ collectively, and individually, as D.

Further, slave output latch 306, may be configured as a slave output latch array such that when PHIS is LOW (and PHISB is HIGH), all of the slave output latches in the slave output latch array may be open, thereby isolating each output storage latch 308 from its respective data output line, $D_{out}x$; but when PHIS is HIGH (and PHISB is LOW), all of the slave output latches in the slave output latch array may be closed, thereby allowing binary output data on each of data output line, $D_{out}x$, to be stored on its respective output storage latch 306. However, for convenience, slave output latch 306, may be referred to at a single latch, since, as addressed above, a single slave output latch 306 may be associated with each data output line, $D_{out}n$.

In operation, when master input latches 302 are closed, slave output latches 306 are open. Therefore, binary input data may pass from each of input electrodes $D_{in}x$ into combinational logic 304 to produce outputs on each of output leads $D_{out}x$. However, the value on each output lead from combinational logic 304 may not proceed to the respective slave output latches 306 to be maintained by slave output latch array 306 until (1) master phase clock signal PHIM goes LOW thereby opening the master input latches in master input latch array 302 and (2) slave clock PHIS goes HIGH thereby closing the slave output latch 306. As soon as slave clock PHIS becomes HIGH, slave output latch 306 may be closed and the values on each output lead from combinational logic 304 may proceed to a respective slave output latch in slave output latch array 306 to be maintained by the latch, as described above with respect to FIG. 2.

As addressed in greater detail below with respect to FIG. 9, the logical signal value presented at each node Q may be provided as an input to one of input electrodes $D_{in}x$ of the next combinational logic 304 of the next combinational logic circuit 300 in a chain of combinational logic circuits 300 on the semiconductor integrated circuit. In this manner, with each full cycle of the external master clock EM_CLK, master phase clock PHIM and slave phase clock PHIS may be sequentially triggered (1) to pass data into the next phase of combinational logic and then (2) to store the output results for presentation on the next clock cycle as inputs to the next unit of combinational logic included on the IC chip.

As described above with respect to FIG. 1, in order to verify the proper operation of the functional units of combinational logic circuits included on an integrated circuit, it may be desirable to be able to test the output of each of the combinational logic circuits included on the IC chip. Therefore, processes have been developed that allow the respective combinational units included on the IC chip to be tested. As described above with respect to FIG. 1, such an approach may be accomplished with the use of multiplexed flip-flops added to the integrated circuit at designated locations so that test input data may be scanned into the integrated circuitry on the IC chip and test output data produced as a result of passing the test input data through the respective combinational logic. The generated output data may be compared to a set of expected results to determine whether the combinational logic circuits performed correctly.

Figure 4:
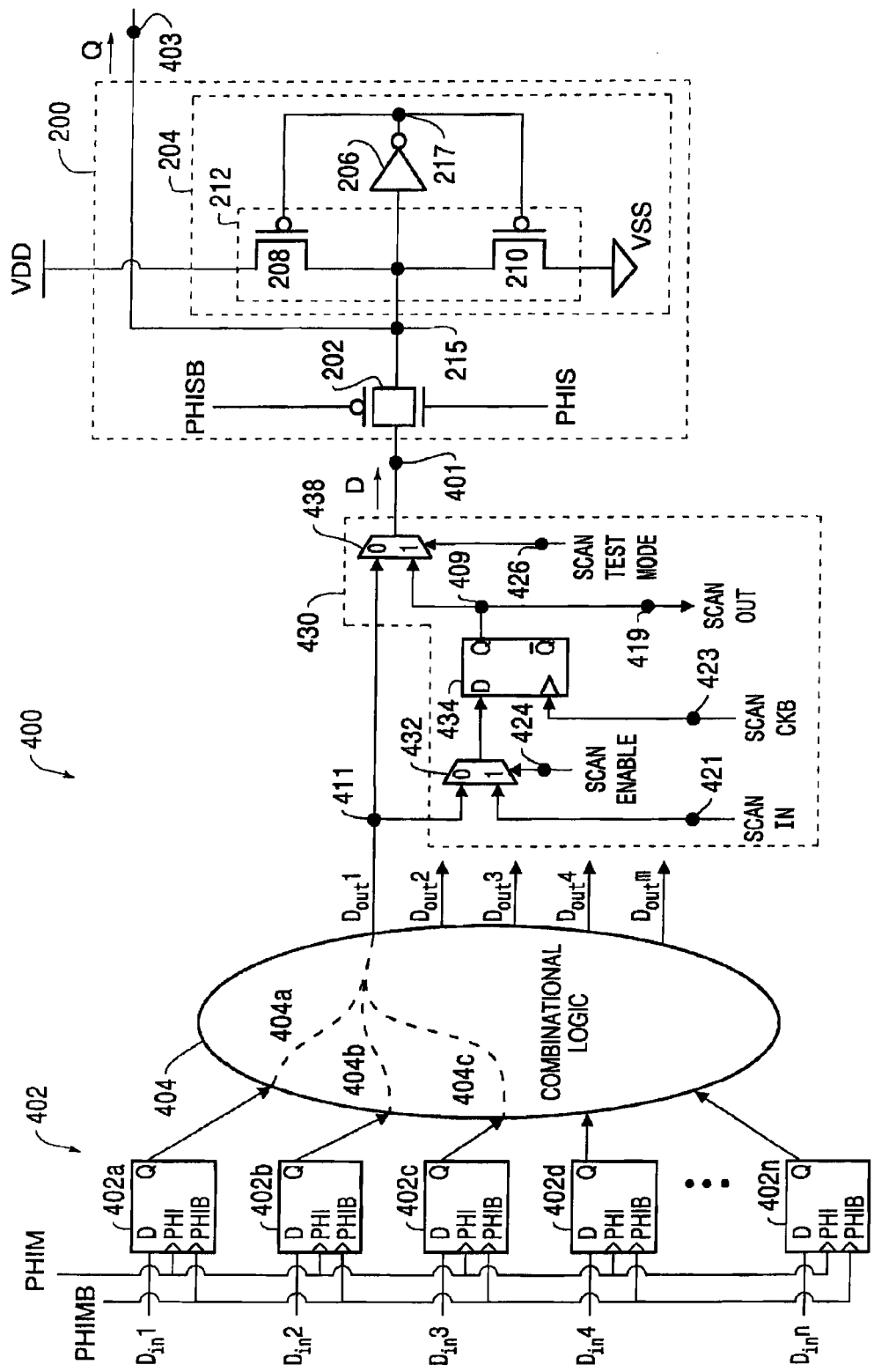
FIG. 4 shows the exemplary portion of a semiconductor integrated circuit (IC) combinational logic circuit of FIG. 3 in which the slave output latch circuit is configured for use with an internal scan chain using a multiplexed flip-flop.

FIG. 4 shows an exemplary portion of a combinational logic circuit, as described above with respect to FIG. 3, in which the slave output latch circuit may be adapted for use with an internal scan chain structure, using a multiplexed flip-flop based approach, that may be used to test the combinational logic included in the circuit in a manner similar to that described above with respect to FIG. 1.

Features in FIG. 4, similar to those described earlier with respect to FIG. 3, have been identified with like numerals. For example, a feature in FIG. 4 corresponding to a like feature described with respect to FIG. 3 will be identified with a number that retains the last two digits of the numeric identifier of the object described with respect to FIG. 3. Unless otherwise indicated, the features and operational function of like numbered objects remain identical to those described above with respect to FIG. 3 and therefore are not addressed in further detail with respect to FIG. 4. However, please note that slave output latch 406 may be the same as the latch described above with respect to FIG. 2 and, therefore, components within latch 406 are labeled with numbers that match those used above with respect to FIG. 2.

As shown in FIG. 4, the combinational logic circuit described above with respect to FIG. 3 may be adapted to support scan chain based testing using a multiplexed flip-flop based approach. In such a modified circuit, the features of master input latch array 402, combinational logic 404, and slave output latch 406, remain the same as those described with respect to FIG. 3 above and, therefore, will not be described again. However, the circuit shown in FIG. 4 includes a multiplexed flip-flop 430 having digital multiplexor 432, flip-flop 434, and second digital multiplexor 438.

Similar to the circuit described above with respect to FIG. 3, the circuit shown in FIG. 4 includes an array of master input latches 402 that controls data signal value transmitted to combinational logic 404. However, due to space limitations, only a single slave output latch 406 that receives and maintains an output data value from a first output lead, $D_{out}x$, from combinational logic 404 is shown. In an actual circuit, a multiplexed flip-flop 430 and a slave output latch 406 would be provided for each output lead, $D_{out}1$, from combinational logic 404. Further, the respective slave output latches may be configured in a slave output latch array similar to that described above with respect to FIG. 3. Further, although different representations are used, please note that each latch in array of master input latches 402 and slave latch 406 may be the same as the latch described above with respect to FIG. 2a and FIG. 2b. Each latch in master input latch 402 is presented using the pin-out block representation described with respect to FIG. 2b, above, while slave latch 406 is represented using the circuit schematic described above with respect to FIG. 2a, above.

As shown in FIG. 4, multiplexor 432 may be controlled by a scan enable signal, SCAN_EN and multiplexor 438 may be controlled by a scan test mode signal, SCAN_TEST_MODE. If the SCAN_EN and SCAN_TEST_MODE signals are LOW, each of the respective multiplexors will pass a signal received on a first input line, indicated in FIG. 4 with a "zero" on each digital multiplexor, to the output of the respective digital multiplexor. If the SCAN_EN and SCAN_TEST_MODE signals are HIGH, each of the respective multiplexors will pass a signal received on a second input line, indicated on FIG. 4 with a "1" on each digital multiplexor, to the output of the respective digital multiplexor. As shown in FIG. 4, the LOW input of multiplexor 432 may be connected to node 411 at the output of combinational logic 404 and the HIGH input line of multiplexor 432 may be connected to a scan input data line (SCAN_IN). The output of multiplexor 432 may be connected to the data input port of flip-flop 434. The LOW input of multiplexor 438 may be connected to an output lead of combinational logic 404, the HIGH input line of multiplexor 438 may be connected to the data output port of flip-flop 434 and the output of multiplexor 438 may be connected through pass transistor switch 202 to node 215 of slave output latch 406. The input clock of flip-flop 434 may be connected to a scan clock (SCAN_CKB). Further, the output port of flip-flop 434 may be connected through inverter 436 to node 409 which may be connected to the HIGH input lead of multiplexor 438, as addressed above, and through inverter 440 to node 419, labeled SCAN_OUT, which may be used to output scan results to a next multiplexed flip-flop in an internal scan chain (not shown in FIG. 4), or to output final scan chain results to a scan test output data storage register (not shown in FIG. 4).

During operation if the SCAN_EN lead and SCAN_TEST_MODE lead are set LOW the circuit performs in exactly the same manner described above with respect to FIG. 3 with the exception that on every clock cycle of PHIM, the output value $D_x$ of combinational logic 404 may be passed via the LOW input lead of multiplexor 432 to the input lead of flip-flop 434. However, unless the SCAN_CKB signal is triggered, the output value $D_x$ may be ignored by flip-flop 434.

In preparation for a scan test, the SCAN_TEST_MODE signal may be set to HIGH, thereby isolating input D at node 401 from combination logic matrix 404. Further, the slave phase clock signal PHIS may be fixed to a HIGH value, thereby closing pass transistor switch 202 in the slave phase latch. In addition, master phase clock signal PHIM may be fixed to a HIGH value, thereby closing the master latch. Such a configuration may be referred to as the transparent mode of the circuit. Next, the SCAN_EN signal may be set to HIGH so that multiplexor 434 may receive data from the SCAN_EN lead 421 and binary scan test input values may be sequentially input at node 421 on the SCAN_IN electrode and the SCAN_CKB signal may be cycled between HIGH and LOW signal values to sequentially read each input value presented on the SCAN_EN line into multiplexed flip-flop 434.

As described above with respect to FIG. 1, the SCAN_OUT electrode at node 419 may be connected to the scan in node 421 of the subsequent multiplexed flip-flop circuitry in the scan chain. Therefore, each time a new binary value is placed on node 421 and scan clock signal SCAN_CKB is cycled on node 423, a new test value may be stored in flip-flop 434 and the previously stored value may be forwarded to the next multiplexed flip-flop until each binary scan test input value has been sequentially read into the circuit.

Once all binary scan test input values have been input into the integrated circuit, and stored to the respective multiplexed flip-flops, a test of the combinational logic of combinational logic matrix 404 may be conducted. For example, to execute a test of the combinational logic of combinational logic matrix 404 using the binary scan test input values, the SCAN_EN signal may be set to LOW, and the values of input electrodes $D_{in}1$ through $D_{in}n$ may be passed into combinational logic 404 to generate respective combinational logic output values $D_x$ which may be passed through LOW input terminal of multiplexor 432 and presented to the input lead of each multiplexed flip-flop 434. A single pulse of scan clock signal SCAN_CKB on node 423 may then read the value into multiplexed flip-flop 434.

Once the test output values have been stored into multiplexed flip-flops 434, the SCAN_EN signal may then be set to HIGH. The scan test results stored in the respective flip-flops 434 may be output by clocking scan clock SCAN_CKB at node 423 a sufficient number of times to pass the string of output data from each of the respective flip-flops 434 through 419 through the chain of remaining multiplexed flip-flops to a final scan output of the last multiplexed flip-flop circuit included in the chain. The scan output may be received by a storage register connected to SCAN_OUT electrode 419 of the last multiplexed flip-flop circuit included in the chain. The SCAN_TEST_MODE signal may be held HIGH during the whole test and the subsequent part of logic receives data from multiplexed flip-flop 434

Although the circuit described above with respect to FIG. 4 may be used to support internal scan testing of a combinational logic circuit, an internal scan chain based on the insertion a multiplexed flip-flop at each test point within the circuit requires significant chip space due to the inclusion of two digital multiplexors, a flip-flop, as well as an additional scan clock SCAN_CKB lead directed to the multiplexed flip flop for each scan point established within the circuit. Further, due to the complexity of the circuit, the chance of introducing faults within the scan chain circuitry itself is greatly increased.

Figure 5:
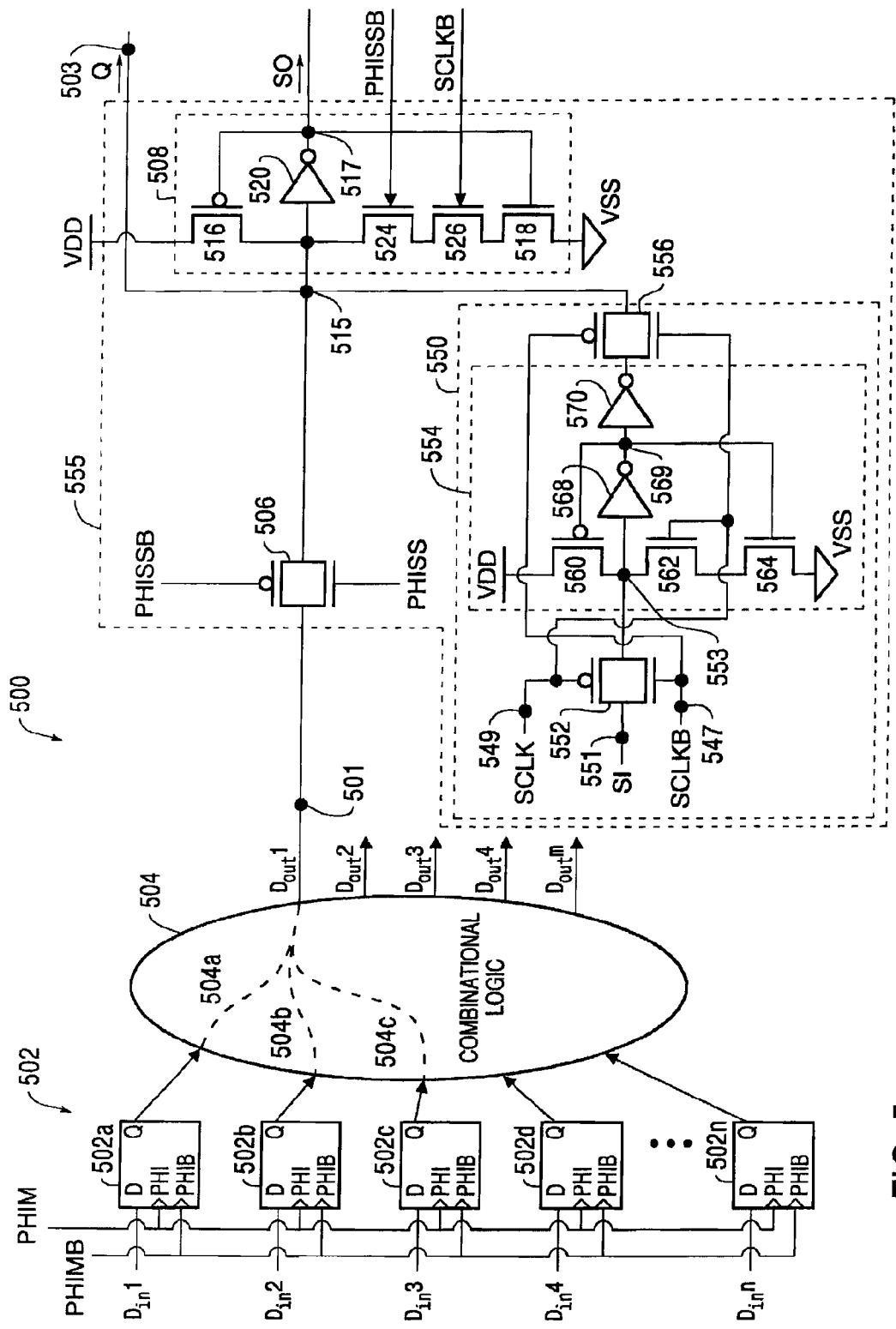
FIG. 5 shows the exemplary semiconductor integrated circuit (IC) combinational logic circuit of FIG. 3 in which the slave output latch circuit is adapted for use with an internal scan chain using an exemplary scan flip-flop latch.

FIG. 5 shows an exemplary semiconductor integrated circuit (IC) combinational logic circuit of FIG. 3, adapted to support scan chain based testing using an approach which is different from the circuit and approach described above with respect to FIG. 4.

Features in FIG. 5 similar to those described earlier with respect to FIG. 3 have been identified with like numerals. For example, a feature in FIG. 5 corresponding to a like feature described with respect to FIG. 3 will be identified with a number that retains the last two digits of the numeric identifier of the object described with respect to FIG. 3. Unless otherwise indicated, the features and operational function of like numbered objects remain identical to those described above with respect to FIG. 3 and therefore are not described again with reference to FIG. 5.

As shown in FIG. 5, combinational logic circuit 500 does not include a multiplexed flip-flop at each test point within the combinational logic IC circuitry to be tested. Instead, the original combinational logic circuit 300, as described above with respect to FIG. 3, is modified so that the modified storage circuit, as shown in FIG. 5 at 508, may be used to support both normal processing as well as scan chain based test processing. The modified output latch may be referred to as a scan flip-flop latch (SFFLAT) 555 and is described in greater detail below.

Specifically, SFFLAT 555, as shown in combinational logic circuit 500, may include two additional n-type transistors. The source of n-type transistor 524 may be connected to the drain of p-type transistor 516 at node 515, the drain of n-type transistor 524 may be connected to the source of n-type transistor 526 and the drain of n-type transistor 526 may be connected to the source of n-type transistor 518. Further, the gate of n-type transistor 524 may be connected to an electrode that may receive inverted slave phase clock signal PHISSB and the gate of n-type transistor 526 may be connected to an electrode that may receive an inverted scan clock signal SCLKB.

During operation, so long as n-type transistor 524 and n-type transistor 526 are both closed, modified storage circuit 508 performs in the same manner described above with respect to feedback inverter 212 in FIG. 2. However, if any one or both of n-type transistor 524 and n-type transistor 526 are open, the connection between node 515 and VSS is broken. As a result, SFFLAT 555 may be controlled by inverted scan slave phase clock signal PHISSB and inverted scan clock signal SCLKB to serve as a semi-fighting latch, as described in greater detail below.

The latch is non-fighting for a change LOW to HIGH at node 515 and fighting for a change of HIGH to LOW at note 515. Therefore, when in operation supporting normal processing functions of combinational logic circuit 500, inverted scan clock signal SCLKB may be set HIGH, and SFFLAT 555 operates in the same manner as output storage latch 306, described with respect to FIG. 3, receiving and maintaining output data signal values received from combinational logic 504. However, in support of scan chain based testing, SFFLAT 555 may be used to store and forward both scan test input values, as well as scan test output values, as described in greater detail below.

In addition to the modifications made to SFFLAT 555, described above, combinational logic circuit 500 may also include a scanning control circuit 550 that may be used to control receipt and sequential shifting scan test input data in preparation of a scan test, as well as to control the receipt and sequential shifting scan test output data after completion of a scan test, as described in greater detail below.

As shown in FIG. 5, scanning control circuit 550 may include a first scan passthrough switch 552, a output storage circuit 554, and a second scan passthrough switch 556. First scan passthrough switch 552 may be configured so that the latch may be closed when scan clock signal SCLK is LOW and inverted scan clock signal SCLKB is HIGH. Second scan passthrough switch 556 may be configured so that the latch may be closed when scan clock signal SCLK is HIGH and inverted scan clock signal SCLKB is LOW.

In operation, when SCLK is LOW and inverted scan clock signal SCLKB is HIGH, first scan passthrough switch 552 may be closed and second scan passthrough switch 556 may be open and first scan passthrough switch 552 may pass a signal value received at node 551 to input node 553 of output storage circuit 554 and output storage circuit 554 may maintain the signal value received. When scan clock signal SCLK becomes HIGH and inverted scan clock signal SCLKB becomes LOW, first scan passthrough switch 552 may be open and second scan passthrough switch 556 may be closed and the signal value maintained by output storage circuit 554 may be passed to node 515, where the passed signal value may be maintained by storage circuit 508, as described in greater detail below. Note that during this mode, PHISS may be held LOW and PHISSB may be held HIGH to avoid contention at node 515.

Output storage circuit 554, shown in FIG. 5 may include a HIGH voltage source, VDD, a p-type transistor 560, a first n-type transistor 562, a second n-type transistor 564, a first inverter 568, a second inverter 570 and a LOW voltage source VSS. VDD may be connected to the source electrode of p-type transistor 560, the drain of p-type electrode 560 may be connected to the source electrode of n-type transistor 562 at node 553, the drain of n-type transistor 562 may be connected to the source of n-type transistor 564, and the drain of n-type transistor 564 may be connected to VSS. The input side of first inverter 568 may be connected, at node 553, to the junction of the drain electrode of p-type transistor 560 with the source electrode of n-type transistor 562. The output side of first inverter 568 may be connected to node 569 which may be connected to both the gate of p-type transistor 560 and to the gate of n-type transistor 564. In addition the gate of n-type electrode 562 may be connected to scan clock signal SCLK.

In operation, assuming that scan clock SCLK is HIGH, and hence n-type transistor 562 may be closed, if a HIGH value is placed at node 553 the value may be inverted by first inverter 568 and a LOW value may be placed on node 569. A LOW value on node 569 results in closing p-type transistor 560 and opening n-type transistor 564. As a result, node 553 may be connected to HIGH voltage source VDD and the value at node 553 may be held HIGH. Alternatively, if a LOW value is placed at node 553 the value may be inverted by first inverter 568 and a HIGH value may be applied at node 569 and across the gates of both p-type transistor 560 and n-type transistor 564. As a result of placing a HIGH value at node 569, p-type transistor 560 opens and n-type transistor 564 closes thereby forming a direct connection between node 553 and VSS. In this manner the LOW value placed at 553 may be maintained.

As addressed above, the gate of n-type electrode 562 may be connected to scan clock signal SCLK. Since, scan clock signal SCLK is LOW when first scan passthrough switch 552 is closed, the connection between node 553 and VSS is open. As a result, output storage circuit 554 avoids a scenario in which a HIGH signal value provided via electrode SI is forced to set the signal value of node 553 to HIGH when node 553 is grounded, i.e., the circuit avoids "fighting" between the new input value and a previous stored value being maintained by storage circuit 554.

P-type transistor 560 may be sized so that p-type transistor 560 operates as a weak pull-up transistor. For example, when a LOW value needs to be placed at node 553, which is initially HIGH, circuit 554 may exhibit a fighting style behavior, but the initially HIGH value at node 553 may be overwritten by a LOW value because p-type transistor 560 operates as a weak pull-up transistor. When SCLK goes HIGH, switch 552 is open and node 553 may maintain a LOW value because n-type transistor 562 is closed. If switch 556 is closed, the value stored in node 553 may be passed through inverter 568 and inverter 570 to node 515. When SCLK is HIGH, PHISS may be LOW, as explained below with respect to the clock circuit presented in FIG. 8. Hence switch 506 may be open and n-type transistor 524 may be closed, since PHISSB may be HIGH, and n-type transistor 526 may be open because SCLKB may be LOW. If node 515 was HIGH, node 517 may be LOW and P-type transistor 516 may be closed. A LOW value from 553 may be passed through inverter 568 and inverter 570 to node 515 and the weak pull-up of p-type transistor 516 may be closed. A LOW value from node 553 may be passed through inverter 568 and inverter 570 to node 515 and the weak pull-up of p-type transistor 516 may be overwritten by strong pull-down of inverter 570. If node 515 was LOW, a HIGH value from node 553 may be passed through inverter 568 and inverter 570 to node 515 and since n-type transistor 526 is open, it avoids fighting a HIGH value at node 515. When SCLK goes back to LOW, n-type transistor 526 may be closed and switch 556 may be open. A HIGH value at node 515 may be inverted by inverter 520, thereby placing a LOW value at node 517, which closes p-type transistor 516, opens n-type transistor 518 and keeps a HIGH value at node 515. A LOW value at node 515 may be inverted by inverter 520, thereby placing a HIGH value at node 517. P-type transistor 516 may, therefore, be open, and n-type transistor 518 may be closed, thereby maintaining a LOW value at node 515.

Figures 6, 7:
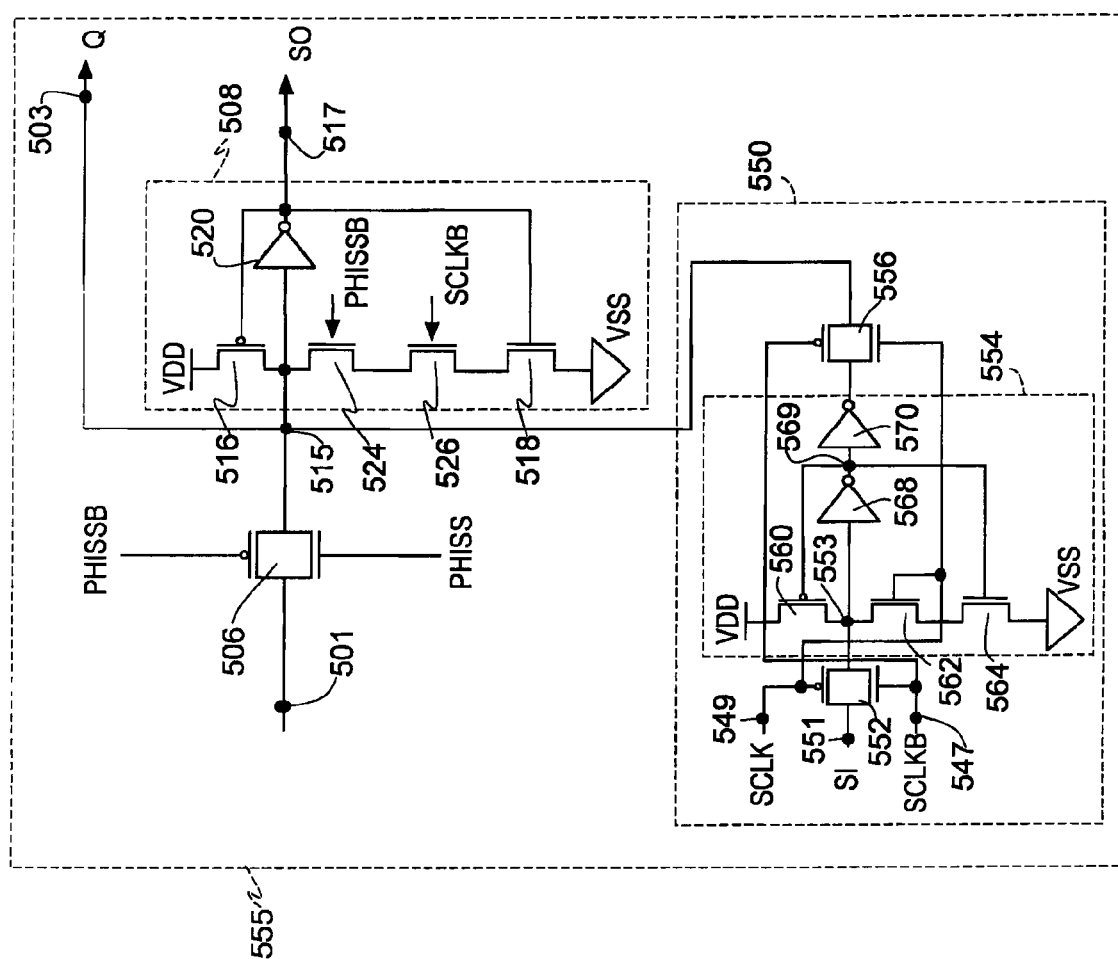
FIG. 6 shows, in isolation, an exemplary slave output latch circuit adapted for use with an internal scan chain using an exemplary scan flip-flop latch.
FIG. 7 shows an exemplary pin-out block representation of the slave output latch circuit with integrated scan flip-flop latch shown in FIG. 6.

FIG. 6 shows, in isolation, an SSFLAT output latch 555 with a passthrough switch 506, a modified storage circuit 508, and a scanning control circuit 550, in isolation from any other circuitry. The combined circuitry may be referred to as a scan-enabled SSFLAT module 555. FIG. 7 shows an exemplary pin-out block representation of scan-enabled SSFLAT module, or SSFLAT module 555. As shown in FIG. 7, the pin-out block representation of SSFLAT module 555 may include input pins D, SI, PHISS, PHISSB, SCLK, SCLKB and output pins Q and SO. These input and output pins correspond with the input and output nodes described above with respect to FIG. 5 and FIG. 6. Specifically, input D represents node 501 in FIG. 5 which is connected to an output lead $D_{out}x$ of combinational logic 504; PHISS and PHISSB correspond to the n-type and p-type gate leads on passthrough switch 506 and n-type transistor 524, that receive slave phase clock signal PHISS and inverted slave phase clock signal PHISSB, respectively; output Q represents node 503 in FIG. 5 and FIG. 6 which presents a single binary output value output by combinational logic 504 on one of the respective one of output leads $D_{out}x$; and output SO represents node 517 in FIG. 5 and FIG. 6 which, when scan chain mode is enabled, forwards scan test input data or scan test output data along the scan chain, as addressed in greater detail below.

Figure 8:
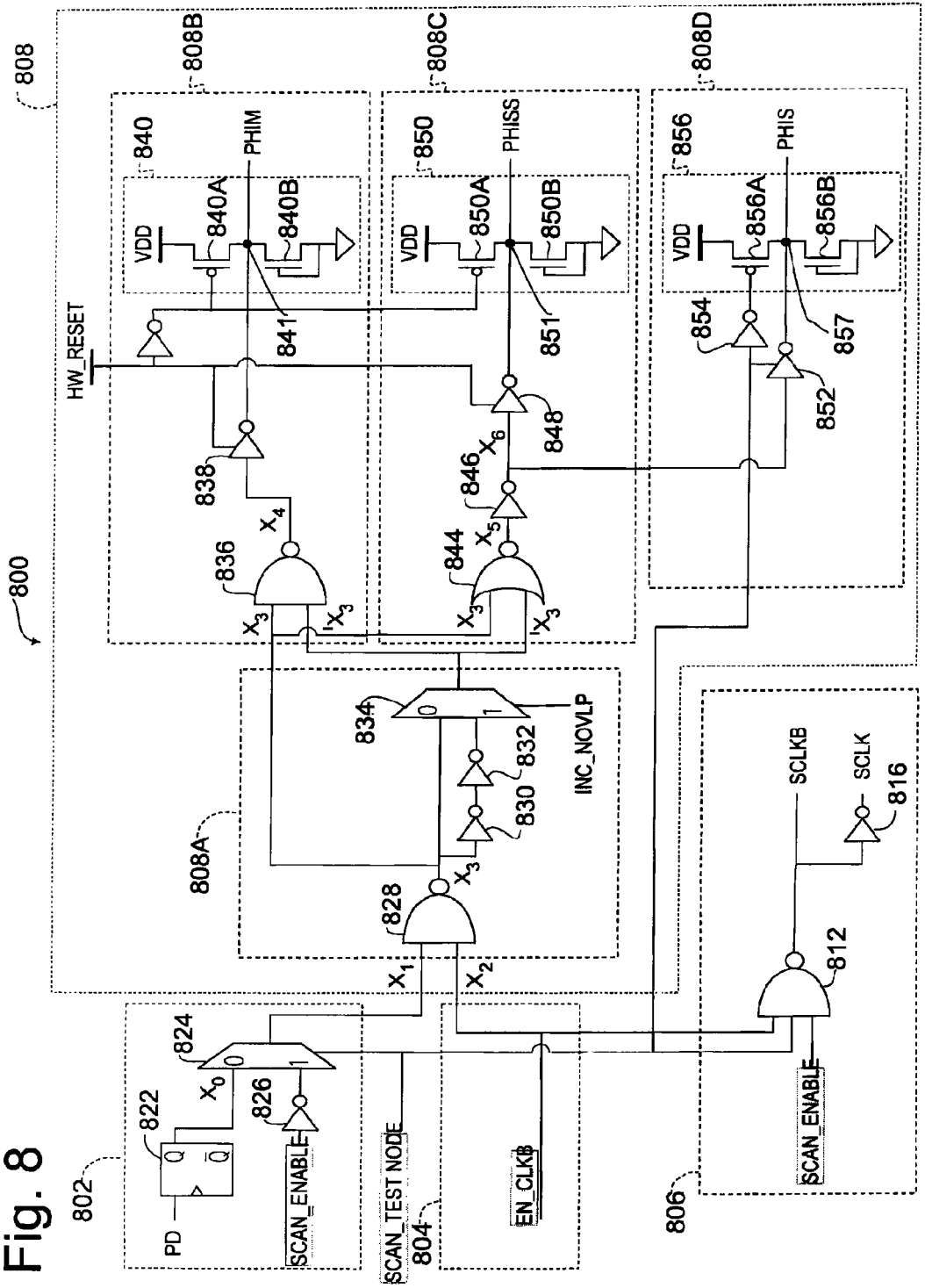
FIG. 8 shows an exemplary clock circuit that generates timing signals for operating the exemplary combinational logic circuit with scan flip-flop latch shown in FIG. 5.

FIG. 8 shows an exemplary clock circuit that generates timing signals for operating the exemplary combinational logic circuit 500 with an SSFLAT module 555, as shown in FIG. 5, during both normal functional operations and during scan chain based testing. As shown in FIG. 8, exemplary clock circuit 800 may include four sections: scan-enable module 802; external clock module 804; scan clock module 806; and master/slave clock module 808, each of which is described in detail below.

Scan-enable module 802 may receive a power down signal PD, a scan enable signal SCAN_ENABLE and scan test mode signal SCAN_TEST_MODE. Further, scan-enable module 802 outputs a single data signal, labeled $X_1$. As shown in FIG. 8, scan-enable module 802 includes an inverter 826, a flip flop 822, and a digital multiplexor 824 controlled by scan test signal SCAN_TEST_MODE. Power down signal PD may be supplied via flip flop 822 to the LOW input line of digital multiplexor 824. Scan enable signal SCAN_ENABLE may be supplied via inverter 826 to the high input line of digital multiplexor 824. The single output data signal $X_1$ may be produced at the output of digital multiplexor 824. Therefore, when scan test signal SCAN_TEST_MODE is HIGH, output data signal $X_1$ may be the same as inverted scan enable signal SCAN_ENABLE; when scan test signal SCAN_TEST_MODE is LOW, output data signal $X_1$ may be the same as power down signal PD.

External clock module 804 may receive an external master clock signal EM_CLK and outputs the signal to both NAND gate 812 of scan clock module 806, described below, and NAND gate 828 of a first section of a master/slave clock module 808a, described below.

Scan clock module 806 may receive scan enable signal SCAN_ENABLE, EM_CLK and scan test signal SCAN_TEST_MODE. Further, scan clock module 806 outputs scan clock SCLK and inverted scan clock SCLKB, described above with respect to FIG. 5. As shown in FIG. 8, scan clock module 806 includes a NAND logic gate 812 and inverter 816. Signal EM_CLK, signal SCAN_TEST_MODE and the scan enable signal SCAN_ENABLE may be supplied to the input lines of NAND gate 812. The output of NAND gate 812 is presented as inverted scan clock SCLKB. Scan clock SCLK may be produced by passing the output of digital multiplexor 814 through inverter 816.

Master/slave clock module 808 may receive output signal $X_1$ from scan-enable module 802, EM_CLK from external clock module 804, scan test signal SCAN_TEST_MODE, signal INC_NOVLP, a hardware reset control signal HW_RESET, a HIGH voltage signal VDD and a LOW voltage signal VSS. Further, master/slave clock module 808 outputs master phase clock signal PHIM, slave phase clock signal PHIS and scan slave phase clock signal PHISS, described above with respect to FIG. 3 and FIG. 5. Signals PHIMB, PHISB and PHISSB are derived by inverting PHIM, PHIS and PHISS, respectively.

A first section of master/slave clock module 808, labeled in FIG. 8 as 808A, may include NAND gate 828, inverter 830, inverter 832 and digital multiplexor 834. A second section of master/slave clock module 808, labeled in FIG. 8 as 808B, may include NAND gate 836, and inverting tri-state switch 838, an inverter 839 and pull-up/pull-down transistors 840. A third section of master/slave clock module 808, labeled in FIG. 8 as 808C, may include a NOR gate 844, inverter 846, and inverting tri-state switch 848 with pull-up/pull-down transistors 850. A fourth section of master/slave clock module 808, labeled in FIG. 8 as 808D, may include inverting tri-state switch 852, inverter 854, and pull-up/pull-down transistors 856. Note that pull-up/pull-down transistors 840, 850 and 856 may be similarly configured with a HIGH voltage source VDD, a p-type transistor, labeled 840A, 850A and 856A, respectively, an n-type transistor, labeled 840B, 850B and 856B, respectively, and a LOW voltage source VSS.

Master/slave clock module section 808A may receive signal $X_1$ from scan-enable module 802, may receive signal EM_CLK from external clock module 804 and may output signal $X_3$ and '$X_3$. Signal $X_1$ and EM_CLK may be received as inputs to NAND gate 828. The output of NAND gate 828 may be signal $X_3$, which may be further processed to produce signal '$X_3$. Digital multiplexor 834 may be controlled by external signal INC_NOVLP. For example, signal $X_3$ may be supplied to the LOW input line of digital multiplexor 834 and signal $X_3$ may also be supplied to the high input line of digital multiplexor 834 after having passed through inverter 830 and inverter 832. Therefore, if signal INC_NOVLP is LOW, output signal '$X_3$ from digital multiplexor 834 may be a delayed form of signal $X_3$. If signal INC_NOVLP is HIGH, output signal '$X_3$ from digital multiplexor 834 may be a more delayed version of $X_3$. Unless otherwise noted, signal INC_NOVLP may be assumed to be HIGH and, therefore, signal '$X_3$ is a slightly delayed version of $X_3$.

Master/slave clock module section 808B may receive signal $X_3$ and '$X_3$ from section 808A and outputs master phase clock signal PHIM. Signal $X_3$ and signal '$X_3$ may be received as inputs to NAND gate 836. The output of NAND gate 836 may be signal $X_4$. Signal $X_4$ may be inverted by inverting tri-state inverter 838 and maintained by pull-up/pull-down 840 at node 841. The inverted $X_4$ signal may be presented outside of clock circuit 800 as master phase clock signal PHIM. PHIMB is generated by inverting PHIM. A hardware reset control signal, HW_RESET, may control tri-state inverter 838, and via an inverter 839, control the control signal applied to p-type transistor 840a of pull-up/pull-down 840. For example, by setting signal HW_RESET to HIGH, tri-state inverter 838 may be turned off and a LOW value may be applied to p-type transistor 840a of pull-up/pull-down 840, thereby holding the value of clock signal PHIM to HIGH.

Master/slave clock module section 808C may receive signal $X_3$ and '$X_3$ from section 802A and outputs scan slave phase clock signal PHISS. PHISSB is generated by inverting PHISS. Signal $X_3$ and signal '$X_3$ may be received as inputs to NOR gate 844. The output of NOR gate 844 may be signal $X_5$. Signal $X_5$ may be inverted by inverter 846 to produce signal $X_6$. Signal $X_6$ may be inverted by tri-state inverter 848 and maintained by pull-up/pull-down 850 at node 851. The inverted $X_6$ signal may be presented outside of clock circuit 800 as scan slave phase clock signal PHISS. The hardware reset control signal, HW_RESET, may control tri-state inverter 848, and via an inverter 839, control the control signal applied to p-type transistor 850a of pull-up/pull-down 850. For example, by setting signal HW_RESET to HIGH, tri-state inverter 848 may be turned off and a LOW value may be applied to p-type transistor 850a of pull-up/pull-down 840, thereby holding the value of clock signal PHISS to HIGH.

Master/slave clock module 808D may receive signal $X_6$ from section 808C, may receive scan test signal SCAN_TEST_MODE and outputs slave phase clock signal PHIS. Signal $X_6$ may be received from section 808C, inverted by tri-state inverter 852 and maintained by pull-up/pull-down 856 at node 857 as the clock signal PHIS. PHISB is generated by inverting PHIS. However, the PHIS signal level at node 857 may be overwritten based on the value of signal SCAN_TEST_MODE. For example, SCAN_TEST_MODE may control tri-state inverter 852, and via an inverter 854, may control the control signal applied to p-type transistor 856a of pull-up/pull-down 856. For example, by setting signal SCAN_TEST_MODE to HIGH, tri-state inverter 848 may be turned off and a LOW value may be applied, via inverter 854 to p-type transistor 856a of pull-up/pull-down 856, thereby holding the value of clock signal PHIS to HIGH.

The signal at node 857 may be presented outside of clock circuit 800 as slave phase clock signal PHIS.

Figure 10:
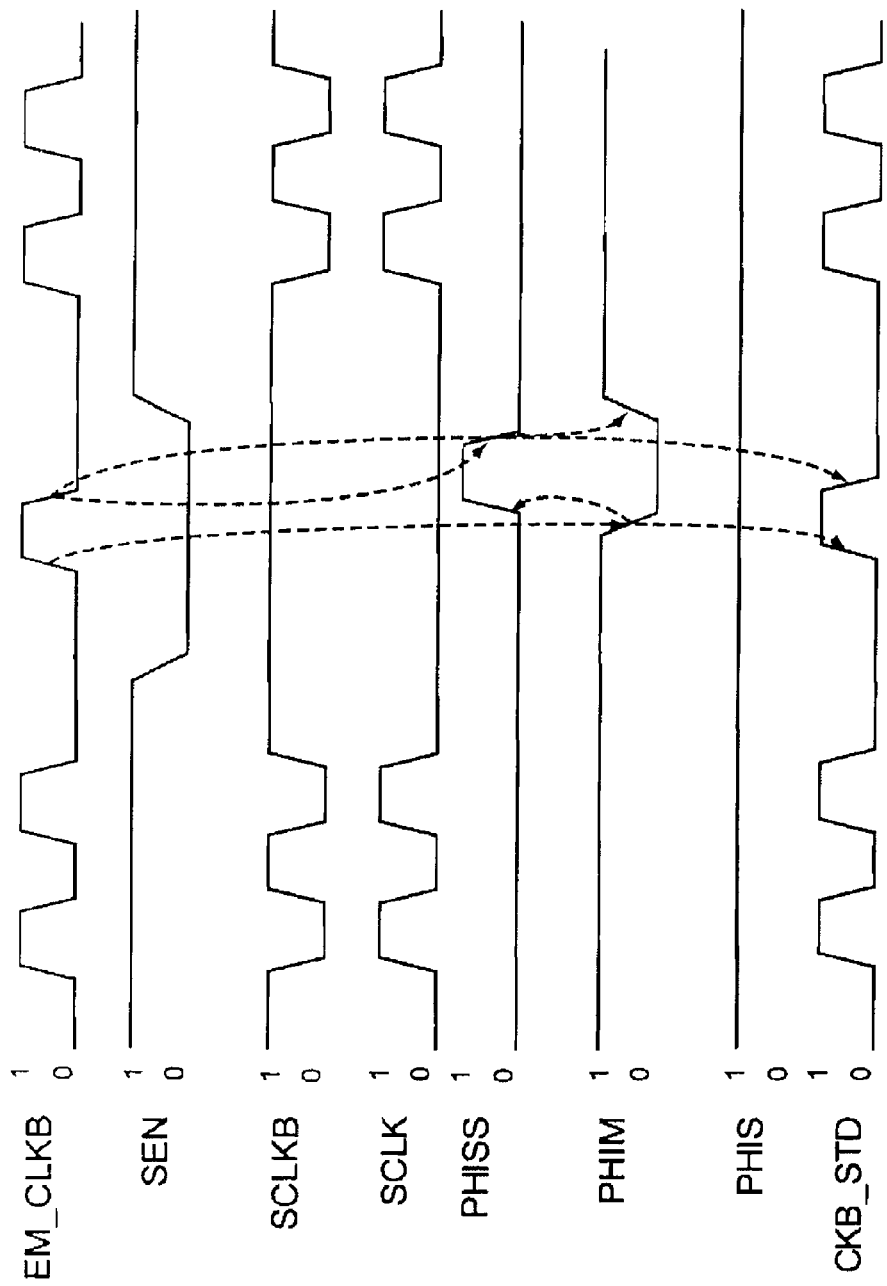
FIG. 10 shows exemplary clock timing relationships for exemplary clock signals described above with respect to FIG. 8.

FIG. 10 shows exemplary clock timing relationships between an exemplary external master clock EM_CLK, an exemplary master phase clock signal PHIM, an exemplary slave phase clock signal PHIS, and an exemplary scan slave phase clock signal PHISS, as described above with respect to clock circuit 800 in FIG. 8.

For example, master phase clock signal PHIM and slave phase clock signal PHIS, shown in FIG. 10, may each represent a single phase of a master/slave two-phase clock generated by master/slave clock module 808 of clock circuit 800, described above with respect to FIG. 8. However, two separate signals, PHIS and PHISS, may be needed to control a combinational logic circuit, such as combinational logic circuit 900, as described below with respect to FIG. 9, that includes both scan enabled and non-scan enabled output latches. For example, the slave clock signal PHIS may be used to control an output latch that does not support scan testing, such as latch 200 described above with respect to FIG. 2a, FIG. 2b and FIG. 3, while slave clock signal PHISS may be used to control a scan enabled output latch, such as scan flip-flop latch (SFFLAT) 555, described above with respect to FIG. 5 and FIG. 6. Further, the values of PHIS and PHISS may be overwritten with one of HIGH and LOW values based on the respective operational modes in which a combinational logic circuit is operated, as described below in greater detail with respect to Table 4.

For example, as shown in FIG. 10, the rising edge of external master clock EM_CLK, via external clock module 804 of clock circuit 800, may lead the falling edge of master phase clock signal PHIM, which in turn may lead the rising edge of scan slave phase clock signal PHISS. The falling edge of external master clock EM_CLK may lead the falling edge of scan slave phase clock signal PHISS, which in turn may lead the rising edge of master phase clock signal PHIM. The exemplary timing shown in FIG. 10 is exemplary only, and represents exemplary timing relationships in a mode in which slave clock signal PHIS is held constant The timing relationships, addressed above, may be important to the physical opening and closing of electronic components used to implement control combinational logic circuit 900. For example, although the opening and closing of electronic components, e.g., transistors, latches, flip-flops, multiplexors, etc., may be discussed with respect to the logic level, e.g., HIGH or LOW, of the respective driving signals used to control the respective components, the physical response of the respective components may actually be driven by the rising and falling edges of the respective driving signals. Therefore, such relationships may be considered during the circuit design process based on the mix and nature of the components used to implement the respective circuits, e.g. rising edge driven components, falling edge driven components, etc.

Table 1 presents an overview of signal value relationships at each of the respective nodes identified in the description of exemplary clock circuit 800, for a single cycle of external master clock EM_CLK, when the signal SCAN_TEST_MODE is set LOW, and SCAN_ENABLE may be set to ANY VALUE. As described in greater detail, below, such SCAN_TEST_MODE and SCAN_ENABLE values may be applied in order to allow combinational logic circuit 500 to operate in normal operational mode, i.e., not in scan chain test mode, to sequentially pass input data into combination logic 504, and then pass generated output results to the next combination logic. In such a mode, combinational logic circuit 500 may operate in the same manner as combinational logic circuit 300, as described above with respect to FIG. 3.

TABLE 1

| Signal Name | Signal Value Dependencies | |
| --- | --- | --- |
| EM CLK | 1 | 0 |
| SCAN TEST MODE | 0 | 0 |
| SCAN ENABLE | X | X |
| SCLK | 0 | 0 |
| SCLKB | 1 | 1 |
| PHIM | 0 | 1 |
| PHIS | 1 | 0 |
| PHISS | 1 | 0 |

X = Don't Care

Table 2 presents an overview of signal value relationships at each of the respective nodes identified in the description of exemplary clock circuit 800, for a single cycle of external master clock EM_CLK, when the signal SCAN_TEST_MODE is set HIGH, and SCAN_ENABLE is set HIGH. As described in greater detail below, such values may be applied to SCAN_TEST_MODE and SCAN_ENABLE to isolate each SFFLAT from combination logic 504, and thus, such values may be set prior to sequentially inputting and shifting new test data values into the respective SSFLATs in a scan chain, or to shift test results out of a scan chain after a test has been conducted and a binary test result may be stored at node 515 of each storage circuit 508 in the scan chain.

TABLE 2

| Signal Name | Signal Value Dependencies | |
| --- | --- | --- |
| EM CLK | 1 | 0 |
| SCAN TEST MODE | 1 | 1 |
| SCAN ENABLE | 1 | 1 |
| SCLK | 1 | 0 |
| SCLKB | 0 | 1 |
| PHIM | 1 | 1 |
| PHIS | 1 | 1 |
| PHISS | 0 | 0 |

Table 3, below, presents an overview of signal value relationships at each of the respective nodes identified in the description of exemplary clock circuit 800, for a single cycle of external master clock EM_CLK, when the signal SCAN_TEST_MODE is set HIGH, and SCAN_ENABLE is set LOW. Such SCAN_TEST_MODE and SCAN_ENABLE values may be applied after test values have been sequentially input and stored at node 515 in each storage circuit 508 in a scan chain. As described in greater detail below, by setting SCAN_ENABLE to LOW for a single clock cycle allows the test data values to be passed through master input latch array 502 into combinational logic 504 and for the resulting data values to be passed through passthrough switch 506 and stored at node 515 of each storage circuit 508 in the scan chain. After the test data has been generated and stored, the settings for SCAN_TEST_MODE and SCAN_ENABLE may both be returned to HIGH and the signal value relationships may return to those described above with respect to Table 2, so that the test data may be sequentially shifted out, as described above with respect to Table 2.

TABLE 3

| Signal Name | Signal Value Dependencies | |
|---|---|---|
| EM CLK | 1 | 0 |
| SCAN TEST MODE | 1 | 1 |
| SCAN ENABLE | 0 | 0 |
| SCLK | 0 | 0 |
| SCLKB | 1 | 1 |
| PHIM | 0 | 1 |
| PHIS | 1 | 1 |
| PHISS | 1 | 0 |

Table 4 presents an overview of the relationships between the clock signals that may be used to control combinational logic circuit 500 described above with respect to Tables 1-3.

TABLE 4

| | Mode I SCAN_TEST_MODE = LOW SCAN_ENABLE = DON'T CARE Table 1, above | Mode II SCAN_TEST_MODE = HIGH SCAN_ENABLE = HIGH Table 2, above | Mode III SCAN_ENABLE = LOW Table 3, above |
|---|---|---|---|
| PHIM | Follows Inverted EM_CLK | HIGH | Follows Inverted EM_CLK |
| PHIS | Follows EM_CLK | HIGH | HIGH |
| PHISS | Follows EM_CLK | LOW | Follows EM_CLK |
| SCLKB | HIGH | Follows Inverted EM_CLK | HIGH |
| PD | HIGH | DON'T CARE | DON'T CARE |

As shown in Table 4, combinational logic circuit 500 with scan-enabled SSFLAT module 555 may support three operational modes: Mode I, or functional mode, in which combinational logic circuit 500 operates without consideration of its embedded scan chain test capabilities to functionally process operational data; Mode II, or shift-in/shift-out mode, in which each combinational logic circuit 500 in a scan chain passes data to the next SSFLAT module 555 in the scan chain either to receive a chain of test input data, or to output a chain of test output data; and Mode III, or test execution mode, in which the master phase clock signal may be initiated for one cycle to submit a sequence of test input data, preloaded during a previous Mode II shift-in phase, to a combinational logic and to store the resulting test output data, in preparation for a subsequent Mode II shift-out phase. It should be understood that a next sequence of test input data may be sequentially shifted into the scan chain in preparation for the next test execution phase, as test output data from the previous test execution phase may be sequentially shifted out.

During normal functional operations, i.e., Mode I, or functional mode, signal SCAN_TEST_MODE is fixed LOW, and the SCAN_ENABLE signal may be ignored. As a result, as indicated in Table 1, based on the exemplary clock circuit 800 described above with respect to FIG. 8, inverted scan clock signal SCLKB remains HIGH, master phase clock signal PHIM follows an inverted version of external master clock signal EM_CLK, slave phase clock signal PHIS follows external master clock signal EM_CLK, and scan slave phase clock signal PHISS also follows external master clock signal EM_CLK.

When master phase clock signal PHIM is HIGH, inverted master phase clock signal PHIMB is LOW, and slave/scan slave clock signals PHIS/PHISS are LOW and inverted slave/scan slave signals PHISB/PHISSB are HIGH. When master phase clock signal PHIM is LOW, inverted master phase clock signal PHIMB is HIGH, and slave/scan slave clock signals PHIS/PHISS are HIGH and inverted slave/scan slave signals PHISB/PHISSB are LOW.

Based on the above-described timing relationships, combinational logic circuit 500, as described with respect to FIG. 5, may operate as described below.

Since inverted scan clock signal SCLKB is set HIGH, as shown in Table 1 and Table 4, second scan passthrough switch 556 may be open and no shift-in or shift-out data may be passed from scanning control circuit 550 to node 515 for maintenance by storage circuit 508. Further, because inverted scan clock signal SCLKB is HIGH, transistor 526 in storage circuit 508 may be fixed in a closed state.

When scan slave phase clock signal PHISS is LOW, inverted scan slave phase clock signal PHISSB is HIGH, therefore, when passthrough switch 506 is open, transistor 524 is closed, thereby allowing storage circuit 508 to maintain a previously received signal value.

At the start of the next data processing cycle, however, master phase clock signal PHIM goes HIGH, thereby closing master input latch 502 and allowing an input data signal to pass from input line $D_{in}x$ into combinational logic 504, resulting in a new output data value emerging from combinational logic 504 on output line $D_{out}x$. However, soon after the new output data value emerges on output line $D_{out}x$, PHISS goes HIGH, thereby allowing the new output data value to pass to node 515.

At the time that PHISS is HIGH, and the new output data value is passed to node 515, inverted scan slave phase clock signal PHISSB is LOW and transistor 524 is open. Therefore, there is no closed connection between node 515 and the LOW data signal VSS. This allows the new output data value to be passed to node 515 and avoids "fighting," i.e., a condition in which inverter 510 may be required to place a HIGH signal value at node 515 when node 515 connected to LOW signal source VSS, or ground. For a HIGH to LOW transition, P-type transistor 516 may be always weaker than switch 506 and drivers before that, so the value can be switched. However, when PHISS again becomes LOW, PHISSB becomes HIGH, thereby closing transistor 524 and allowing storage circuit 508 to maintain the newly received output data value, either HIGH or LOW.

During Mode I, the above cycle of events may repeat continuously to process operational data and to generate operational output results.

During Mode II, or shift-in/shift-out mode, each combinational logic circuit 500 in a scan chain may pass data to the next SSFLAT module 555 in the scan chain either to receive a chain of test input data, or to output a chain of test output data. As addressed above, a next sequence of test input data may be sequentially shifted into a scan chain as test output data may be sequentially shifted out.

In preparation for Mode II, both signal SCAN_TEST_MODE and signal SCAN_ENABLE may be set HIGH. As a result, as indicated in Table 2 and Table 4, and based on the exemplary clock circuit 800 described above with respect to FIG. 8, master phase clock signal PHIM is set HIGH, slave phase clock signal PHIS is set HIGH and scan slave phase clock signal PHISS is set LOW. Therefore, master input latch 502 remains closed, passthrough switch 506 remains open, and transistor 524, in storage circuit 508, remains closed. As a result, computational logic 504 may be isolated, by the blocking capabilities of passthrough switch 506, from SSFLAT module 555. However, operation of SSFLAT module 555 may proceed, driven by scan clock SCLK and inverted scan clock SCLKB as described below.

Further, because PHIS is HIGH, the slave output latch of each combinational logic circuit is set in a closed state. Therefore, even though each combinational logic circuit includes a output storage latch that does not support scan chain testing, rather than an SFFLAT module that does support scan chain testing, each combinational logic circuit remains transparent to scan chain testing and, therefore, does not interfere with the scan chain testing process.

As described above with respect to FIG. 5, when SCLK is LOW and inverted scan clock signal SCLKB is HIGH, first scan passthrough switch 552 may be closed and second scan passthrough switch 556 may be open and first scan passthrough switch 552 may pass a signal value received at node 551 to input node 553 of output storage circuit 554 and output storage circuit 554 may maintain the signal value received. When scan clock signal SCLK becomes HIGH and inverted scan clock signal SCLKB becomes LOW, first scan passthrough switch 552 may be open and second scan passthrough switch 556 may be closed and the signal value maintained by output storage circuit 554 may be passed to node 515, where the passed signal value may be maintained by storage circuit 508.

When scan clock signal SCLK becomes HIGH and inverted scan clock signal SCLKB becomes LOW and the signal value maintained by output storage circuit 554 is passed to node 515, n-type transistor 526 of storage circuit 508 may be open. Therefore, there may be no closed connection between node 515 and the LOW signal source VSS, or ground. This allows the new data value to be passed to node 515 and avoids "fighting," i.e., a condition in which scanning control circuit 550 may be required to place a HIGH signal value at node 515 when node 515 may be grounded. If a LOW value needs to be placed on node 515, since p-toye transistor 516 is week, node 515 can be overwritten to a LOW value. However, when SCLK again becomes LOW, SCLKB becomes HIGH, thereby closing transistor 524 and allowing storage circuit 508 to maintain the newly received data value.

As described above, node 515 of SSFLAT module 555 may be connected to node 551 of the subsequent SSFLAT module 555 in a scan chain. In such a configuration, when SCLK is LOW, a data value may be passed from node 551 to node 553 of scanning control circuit 550, and when SCLK is HIGH the stored data value may be passed from 553 to node 515 of SSFLAT module 555, and presented at node 551 of the subsequent SSFLAT module 555.

During Mode II, the above cycle of events may repeat continuously to either load new test input data received at node 551 of a first SSFLAT module 555 into a scan chain or to pass test input data from one SSFLAT module 555 in a scan chain to a subsequent SSFLAT module 555 in a scan chain. Further, after a scan test has been executed, as described below with respect to Mode III, the same Mode II process may be used to pass test output data along the respective SSFLAT modules in a scan chain to a last SSFLAT module 555 and out to a scan test result storage buffer. Such a storage buffer may receive data simultaneously from the last SSFLAT module 555 of a plurality of scan chains, thus allowing results from multiple scan tests to be output in parallel to be analyzed against expected results.

Mode III, or test execution mode, may be executed after implementing Mode II to shift in a sequence of test input data into a scan chain, as described above. During test execution mode, the master and slave phase clock signal may be initiated for one cycle to submit a sequence of test input data stored in the respective SSFLAT modules of the scan chain to a combinational logic and to store the resulting test output data in the same SSFLAT modules of the scan chain.

In transitioning from Mode II, to Mode III, signal SCAN_TEST_MODE is held HIGH, but signal SCAN_ENABLE is set LOW. As a result, based on clock circuit 800 described above with respect to FIG. 8, both slave phase clock signal PHIS and inverted scan clock signal SCLKB may be set HIGH, master phase clock signal PHIM follows inverted external master clock signal EM_CLK, and scan slave phase clock signal PHISS follows external master clock signal EM_CLK.

Since inverted scan clock signal SCLKB is HIGH, second scan passthrough switch 556 is open and no shift-in or shift-out data may be passed from scanning control circuit 550 to node 515 for maintenance by storage circuit 508. Further, because inverted scan clock signal SCLKB is HIGH, transistor 526 in storage circuit 508 may be fixed in a closed state.

As addressed above with respect to Mode II, Mode III may be used immediately after loading a sequential series of test input data into a scan chain. As soon as SCAN_ENABLE is set LOW, on the next EM_CLK going HIGH, master phase PHIM goes to LOW, thus opening the master latch 502 and disconnecting $D_{in}$ from 504. This is followed by PHISS going HIGH and the previously evaluated value generated by combinational logic 504 may be passed to node 515 through the closed switch 506. PHIM, being LOW, blocks the updated value in 515 from affecting the stored value in subsequent SFFLAT's. When EM_CLK goes LOW, PHISS goes LOW, switch 506 opens and node 515 maintains the value stored. PHIM goes HIGH, but since PHISS is LOW, closed switch 502 does not affect the stored value at node 515.

As described above, when PHISS is HIGH, PHISSB is LOW, and n-type transistor 524 of storage circuit 508 is open. Therefore, there may be no closed connection between node 515 and the LOW data signal VSS. This allows the new data value to be passed to node 515 and avoids "fighting," i.e., a condition in which passthrough switch 506 may be required to place a HIGH signal value at node 515 when node 515 may be connected to LOW signal source VSS, or ground. However, when PHISS again becomes LOW, PHISSB becomes HIGH, thereby closing transistor 524 and allowing storage circuit 508 to maintain the newly received data value. The HIGH to LOW transition at node 515 does cause fighting, but since p-type transistor 516 is weak, the value is overwritten.

Mode III may be initiated for one clock cycle, thereby allowing a single stored test input data value at node 515 to be passed to combinatorial logic 504 to generate a new test output data value which is then stored at node 515. Once the once clock cycle is completed, signal SCAN_ENABLE may be set HIGH, and combinational logic circuit 500 may return to Mode II to sequentially scan out the respective stored test output data in the manner described above with respect to Mode III.

Figure 9:
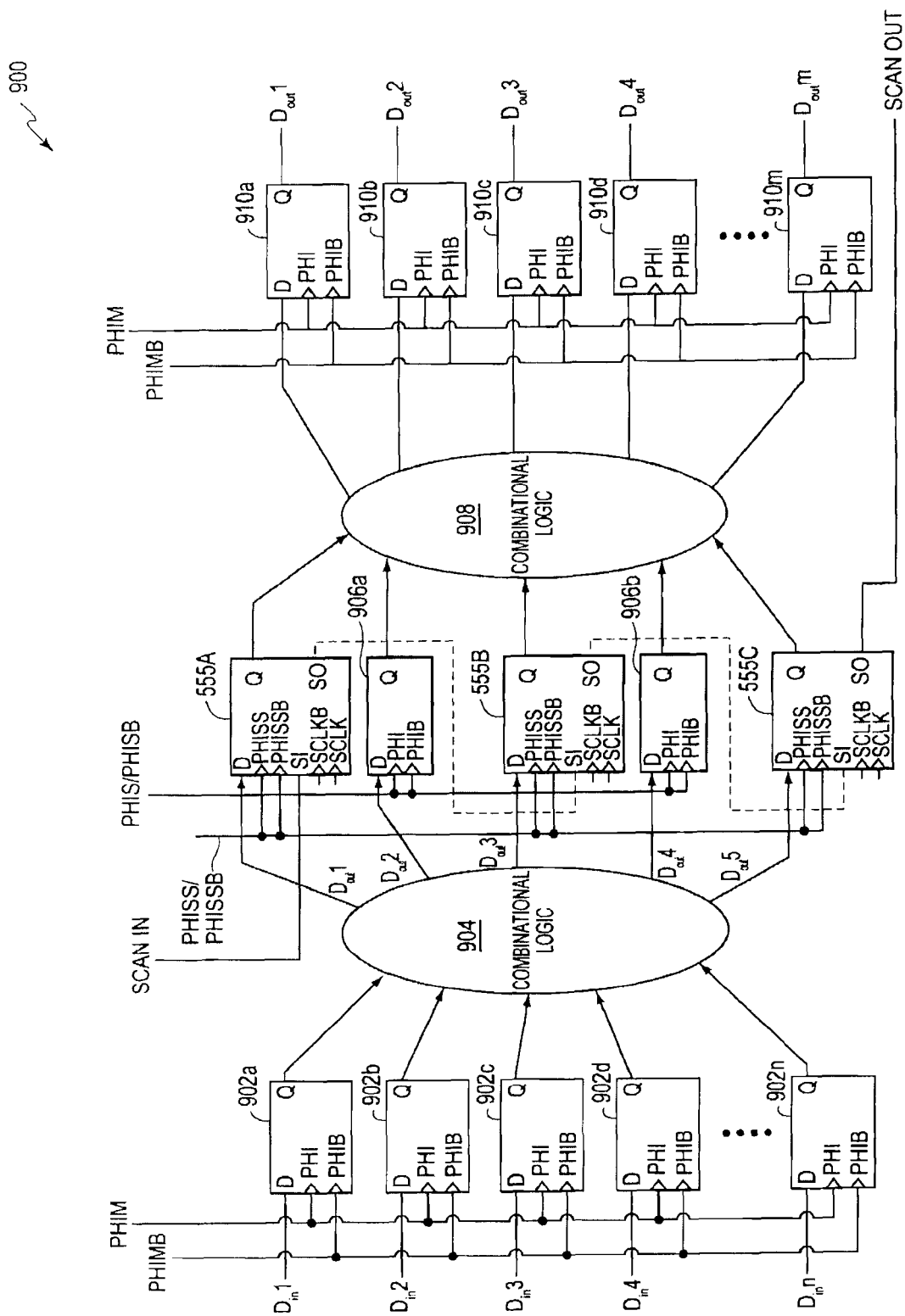
FIG. 9 shows an exemplary combinational logic scan chain that uses a plurality of exemplary scan flip-flop latches and a plurality unaltered output scan latches.

FIG. 9 shows a portion of an exemplary combinational logic scan chain 900 equipped with slave output latch circuits 906a and 906b that do not support scan based testing operations and SSFLAT module 555a, SSFLAT module 555b and SSFLAT module 555c that do support scan chain based testing.

The plurality of combinational logic circuits shown in FIG. 9 may represent only a portion of the total number of combinational logic circuits chained together and placed on a single integrated circuit chip. For example, an exemplary combinational logic circuit 500 as described above with respect to FIG. 5, may be found in FIG. 9 and may include input line $D_{in}1$, master input latch 902A, combinational logic 904, output line $D_{out}1$, and SSFLAT module 555A. Further, an exemplary combinational logic circuit 200 as described above with respect to FIG. 2a, FIG. 2b and FIG. 3, may be found in FIG. 9 and may include input line $D_{in}4$, master input latch 902D, combinational logic 904, output line $D_{out}4$, and slave output latch circuit 906b.

The exemplary portion of a scan chain represented in FIG. 9 includes a total of three combinational logic circuits 500, as described above with respect to FIG. 5, and a total of two combinational logic circuit 300 as described above with respect to FIG. 3. It should be understood that number and type of combinational logic circuits included in FIG. 9 is exemplary only. Any number of combinational logic circuits may be arranged in any manner, e.g., in series, or in parallel, with other combinational logic circuits in the integrated circuit. For example, array of output latches 910 may be provide input data values to a subsequent combinational logic which may generated output data values, each stored in one of a slave output latch circuit that does not support scan based testing operations, e.g., such as latch 200 as described above with respect to FIG. 2, and a slave output latch circuit that does support scan based testing operations, e.g., such as latch 555 as described above with respect to FIG. 5. One such an exemplary integrated circuit may include any number of latches arranged in series, each latch separated from another latch by combinational logic, as shown in FIG. 9. In such a circuit, at least one PHIM-controlled latch may be included between any two PHISS-controlled latches in series; however, any number of alternating PRIM-controlled and PHIS-controlled latches may be placed between any two PHISS-controlled latches in series in the circuit.

As shown in FIG. 9, a scan chain may be formed by the respective SSFLAT modules 555. For example, a first link in the scan chain may be formed by SSFLAT module 555A, a second link in the scan chain may be formed by SSFLAT module 555B, and a third link in the scan chain may be formed by SSFLAT module 555C. The respective SSFLAT modules 555 support functional operations as described above with respect to Mode I, and provide 3 test points for combinational logic 904, as described above with respect to Mode II and Mode III.

Further, as shown in FIG. 9, exemplary combinational logic scan chain 900 may include three slave output latch circuits 906 that support functional operations in Mode I, and that transparently support scan chain testing during Mode II and Mode III, as described above. For example, in Mode II, slave output latch circuits 906 do not interfere with the sequential loading of test input data into the scan chain, nor interfere with the sequential shifting out of test output data from the scan chain. Further, in Mode III, slave output latch circuits 906 transparently pass test output data from, for example, output leads of combinational logic 904 to the input leads combinational logic 908b.

For example, as described above with respect to Table 4, during scan based testing operations, e.g., Mode II and Mode III, as described above, slave phase clock signal PHIS is fixed to a HIGH signal value. In this manner, slave output latch circuits 906 may be configured to transparently pass test output data from, for example, output leads of combinational logic 904 to the input leads of combinational logic 908.

Figure 11:
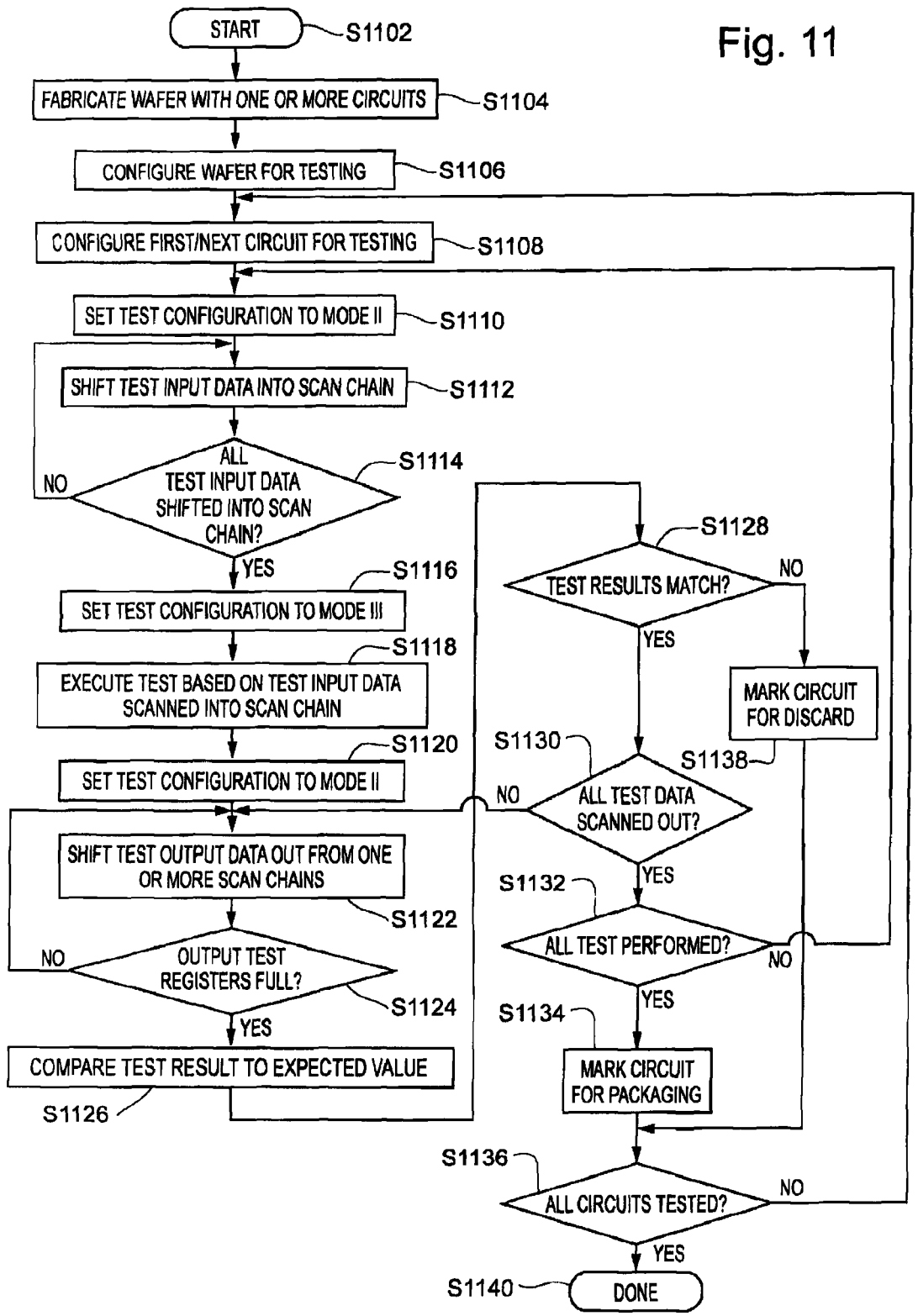
FIG. 11 shows a flow-chart of an exemplary process for scan chain based testing of one or more integrated circuits on a semiconductor wafer.

FIG. 11 shows a flow-chart of an exemplary process for scan chain based testing of one or more integrated circuits on a semiconductor wafer. As shown in FIG. 11, operation of the method begins at step S1102 and proceeds to step S1104.

In step S1104, a semiconductor wafer is fabricated that includes one or more integrated circuits. Each integrated circuit may include a plurality of combinational logic circuits, as described above with respect to FIG. 9. These combinational logic circuits support scan chain based testing of the combinational logic matrices using any number of scan chains, as described above with respect to FIG. 5 and FIG. 9. Further, these scan chains may scan test data out to any number of output scan registers, as described above with respect to FIG. 9. After the semiconductor wafer, with one or more integrated circuits is fabricated, operation of the method continues to step S1106.

In step S1106, the semiconductor wafer with one or more integrated circuits is configured for testing, for example, by placing the wafer in an automated testing system capable of forming electrical connections to the leads of one or more integrated circuits on the wafer, and operation of the method continues to step S1108.

In step S1108, a first, or next, integrated circuit is prepared for testing by the automated testing system by establishing, e.g., using pins or probes, electrical connections to the control leads of the integrated circuit so that power, control signals and/or data and clock signals may be passed from the automated testing system to the integrated circuit under test, and operation of the method continues to step S1110.

In step S1110 the automated testing system passes power and signals to the integrated circuit to configure combinational logic circuits into Mode II, shift-in/shift-out mode, as described above with respect to Table 4. For example, in preparation for Mode II, both signal SCAN_TEST_MODE and signal SCAN_ENABLE may be set HIGH. As a result, as indicated in Table 2 and Table 4, and based on the exemplary clock circuit 800 described above with respect to FIG. 8, master phase clock signal PHIM is set HIGH, slave phase clock signal PHIS is set HIGH and scan slave phase clock signal PHISS is set LOW. Operation of the method continues to step S1112.

In step S1112, once configured in Mode II, with each cycle of scan clock signal SCLK, each combinational logic circuit in a scan chain may receive a binary bit of test input data via SSFLAT module 555 from either a scan input port at the start of a scan chain or from a preceding SSFLAT module 555 in the scan chain and may pass a binary bit of test input data to the next SSFLAT module 555 in the scan chain, and operation of the method continues to step S1114.

If, in step S1114, all of the test input data needed to execute a test has been loaded, operation of the method continues to step S1116, otherwise operation of the method returns to step S1112.

In step S1116, the automated testing system may pass power and signals to the integrated circuit to configure combinational logic circuits into Mode III, test execution mode, as described above with respect to Table 4. For example, the automated testing system may hold signal SCAN_TEST_MODE to HIGH, but may set signal SCAN_ENABLE to LOW, thereby adjusting the clock signals generated by clock circuit 800, as described above with respect to Table 3 and Table 4 above, thereby configuring combinational logic circuits into Mode III, test execution mode, as described above with respect to Table 4, and operation of the method continues to step S1118.

In step S1118, the master phase clock signal may be initiated for one cycle to submit a sequence of test input data stored in the respective SSFLAT modules of the scan chain to one or more combinational logic matrices and to store the resulting test output data in the same SSFLAT modules of the scan chain, and operation of the method continues to step S1120.

In step S1120, the automated testing system passes power and signals to the integrated circuit to configure combinational logic circuits back into Mode II, shift-in/shift-out mode. For example, both signal SCAN_TEST_MODE and signal SCAN_ENABLE to HIGH, as indicated in Table 2 and Table 4, and based on the exemplary clock circuit 800 described above with respect to FIG. 8, master phase clock signal PRIM is set HIGH, slave phase clock signal PHIS is set HIGH and scan slave phase clock signal PHISS is set LOW. Operation of the method continues to step S1122.

In step S1122, once reconfigured in Mode II, each combinational logic circuit 500 in a scan chain may, with each cycle of scan clock signal SCLK, receive a binary bit of test output data via SSFLAT module 555 from a preceding SSFLAT module 555 in the scan chain and may pass a binary bit of test output data to the next SSFLAT module 555 in the scan chain, or to a scan output port at the end of a scan chain, and operation of the method continues to step S1124.

If, in step S1124, the test application determines that the output registers are full, operation of the method continues to step S1126, otherwise, operation of the method returns to step S1122.

In step S1126, the test output data stored in the output register may be compared to an expected test result, and operation of the method continues to step S1128.

If, in step S1128, the test application determines that the output data in the output register does not match an expected test result, operation of the method continues to step S1138, the circuit is marked for discard for failing to pass the applied test, and operation of the method then continues to step S1136. If, in step S1128, the test application determines that the output data in the output register does match an expected test result, operation of the method then continues to step S1130.

If, in step S1130, the test application determines that all test output data has been scanned out to the scan chain test output registers, operation of the method continues to step S1132, otherwise, operation of the method then returns to step S1122.

If, in step S1132, the test application determines that all desired tests have been executed, operation of the method continues to step S1134, otherwise, operation of the method then returns to step S1110.

In step S1134, the integrated circuit, having passed all applied scan chain based tests, may be marked for packaging, and operation of the method continues at step S1136.

If, in step S1136, the test application determines that all the integrated circuits to be tested have been tested, operation of the method then proceeds to step S1140 and the process terminates, otherwise operation of the method returns to step S1108.

For purposes of explanation, in the above description, numerous specific details are set forth in order to provide a thorough understanding of the SFFLAT and use of the SFFLAT to support scan chain testing of combinational logic circuits. It will be apparent, however, to one skilled in the art that the SFFLAT may be practiced without these specific details. In other instances, well-known structures and devices are shown in block diagram form in order to avoid obscuring the features of the SFFLAT.

While the SFFLAT has been described in conjunction with the specific embodiments thereof, it is evident that many alternatives, modifications, and variations will be apparent to those skilled in the art. Accordingly, embodiments of the SFFLAT as set forth herein are intended to be illustrative, not limiting. There are changes that may be made without departing from the spirit and scope of the invention.

What is claimed is:

1. A integrated circuit that supports scan chain based testing of combinational logic within the integrated circuit, the integrated circuit comprising:
   a plurality of combinational logic circuits, each combinational logic circuit comprising:
      a plurality of input data lines;
      a plurality of output data lines; and
      a plurality of interconnected logic elements configured to receive a binary input data value on each of the plurality of input data lines, to process the received binary input data values based on the interconnected logic elements, and to produce a binary output data value on each of the plurality of output data lines;
   at least one input latch array, wherein each input latch in the at least one input latch array controls passage of a binary input data value to one of the plurality of input data lines of one of the plurality of combinational logic circuits;
   a plurality of scan latches, each scan latch comprising:
      a passthrough switch that controls passage of a binary output data value received on one of the plurality of output lines and that opens and closes based on a value of a first slave phase clock signal; and
      a scanning control circuit that passes one of a scan test input data value and a scan test output data value based on a value of a scan clock signal; and
      an output storage circuit that receives one of a data value from the passthrough switch and a data value from the scan control circuit,
      wherein a first output port of an output storage circuit of a first scan latch is connected to an input port of the scanning control circuit of a second scan latch for passing an output data value stored by the output storage circuit to the input port of the scanning control circuit, and a second output port of the output storage circuit is connected to a next plurality of combinational logic circuits, and
      wherein the output storage circuit includes a first transistor that opens and closes based on a value of the scan clock signal and a second transistor that opens and closes based on an inverted value of the slave phase clock signal, and wherein a connection between the output storage circuit and a low signal source is open when one of the first transistor and the second transistor is open.

2. The integrated circuit of claim 1, wherein the integrated circuit further comprises:
   a plurality of slave output latches, each slave output latch circuit comprising:
      a passthrough switch that controls passage of a binary output data value to an output storage circuit, the input latches opening and closing based on a value of a second slave phase clock signal; and
      wherein an output port of the output storage circuit is connected to an input port of a next plurality of combinational logic elements.

3. The integrated circuit of claim 1, wherein the scanning control circuit controls an input of scan chain data into the output storage circuit.

4. The integrated circuit of claim 3, wherein the scan control circuit further comprises:
   a first scan passthrough switch that controls passage of a scan input data value into the scanning control circuit;
   a scanning control storage circuit that maintains the scan input data value; and
   a second scan passthrough switch that controls passage of the scan input data value to the output storage circuit.

5. The integrated circuit of claim 4, wherein the first scan passthrough switch closes in response to a first signal value on a scan clock signal and the second scan passthrough switch closes in response to a second value on the scan clock signal.

6. The integrated circuit of claim 5, wherein when the scan input data value is passed to the output storage circuit, the second transistor is open.

7. The integrated circuit of claim 6, wherein the second transistor is controlled by an inverted scan clock signal.

8. The integrated circuit of claim 6, wherein when the scan input data value is passed to the output storage circuit, the second transistor is open and the first transistor is closed.

9. The integrated circuit of claim 6, wherein the scan input data value is a binary signal value.

10. A method of performing a scan chain test of combinational logic within an integrated circuit that includes a plurality of scan latches connected together to form a scan chain, each scan latch including an output storage circuit, the method comprising:
    executing a first mode of operation comprising:
      blocking a flow of data into the combinational logic; and
      blocking a flow of data out of the combinational logic; and
    sequentially passing binary scan chain test input data values from a first scan latch in the scan chain to a next scan latch in the scan chain, a first output port of the first scan latch being connected to an input port of a second scan latch for passing an output data value stored by the first scan latch,
    wherein a connection between the output storage circuit of the next scan latch in the scan chain and a low signal source is open.

11. The method of claim 10, the method further comprising:
    closing the connection between the output storage circuit of the next scan latch in the scan chain and a low signal source once a new scan chain test input data value is received by the output storage circuit of the next scan latch in the scan chain.

12. The method of claim 11, the method further comprising:
    executing a second mode of operation comprising:
      passing, in parallel, a plurality of binary scan chain test input data values into a combinational logic;
      generating scan chain test output data values based on the plurality of binary scan chain test input data values and the combinational logic; and
      storing the scan chain test output data values in the output storage circuits of scan latches in the scan chain,
    wherein on passing a scan chain test output data value to an output storage circuit of a scan latch, a connection between the output storage circuit and a low signal source is open.

13. The method of claim 11, the method further comprising:
    closing the connection between the output storage circuit of the scan latch and a low signal source once the scan chain test output data value is received by the output storage circuit.

14. The method of claim 13, the method further comprising re-executing the first mode of operation comprising:
    sequentially passing binary scan chain test output data values from a first scan latch in the scan chain to a next scan latch,
    wherein a connection between the output storage circuit of the next scan latch in the scan chain and a low signal source is open.

15. The method of claim 14, the method further comprising:
    closing the connection between the output storage circuit of the next scan latch in the scan chain and a low signal source once a scan chain test output data value is received by the output storage circuit of the next scan latch.

* * * * *